United States Patent
Takahashi et al.

(10) Patent No.: US 7,466,609 B2
(45) Date of Patent: *Dec. 16, 2008

(54) SEMICONDUCTOR MEMORY DEVICE AND SEMICONDUCTOR MEMORY DEVICE CONTROL METHOD

(75) Inventors: Hiroyuki Takahashi, Kanagawa (JP); Takuya Hirota, Kanagawa (JP); Atsushi Nakagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/882,230

(22) Filed: Jul. 31, 2007

(65) Prior Publication Data

US 2007/0280025 A1    Dec. 6, 2007

Related U.S. Application Data

(63) Continuation of application No. 10/507,117, filed on Sep. 10, 2004, now Pat. No. 7,301,830, which is a continuation of application No. PCT/JP03/02095, filed on Feb. 26, 2003.

(30) Foreign Application Priority Data

Mar. 15, 2002    (JP)    ............................. 2002-072953

(51) Int. Cl.
*G11C 7/22*    (2006.01)
*G11C 8/18*    (2006.01)
*G11C 8/08*    (2006.01)
*G11C 5/14*    (2006.01)
*G11C 7/12*    (2006.01)

(52) U.S. Cl. .................. 365/194; 365/189.11; 365/226; 365/230.06

(58) Field of Classification Search ................. 365/149, 365/193, 194, 222, 189.09, 226, 230.06, 365/189.11

See application file for complete search history.

(56) References Cited

U.S. PATENT DOCUMENTS 5,086,238 A    2/1992    Watanabe et al.

(Continued)

FOREIGN PATENT DOCUMENTS

JP    2-000350 A    1/1990

(Continued)

OTHER PUBLICATIONS

Office Action issued Aug. 7, 2008, in U.S. Appl. No. 11/907,442, 7 pages.

*Primary Examiner*—J. H. Hur
(74) *Attorney, Agent, or Firm*—Foley & Lardner LLP

(57) ABSTRACT

A cell core unit and its peripheral circuit are driven by a relatively low voltage power supply. A constant voltage that does not depend on the power supply voltage is provided as a boosted voltage (VBOOST) to be supplied to a control signal for a word line of the cell core unit. A sense amplifier amplifies a higher voltage level of a bit line to the power supply voltage. Then, a circuit for generating a signal for defining the transition timing and/or the pulse width of a control signal from the peripheral circuit to the cell core unit performs signal delay using a delay circuit having a characteristic in which a delay time thereof decreases with reduction of the provided power supply voltage.

2 Claims, 19 Drawing Sheets

U.S. PATENT DOCUMENTS

| | | |
|---|---|---|
| 5,130,564 A | 7/1992 | Sin |
| 5,197,033 A | 3/1993 | Watanabe et al. |
| 5,222,044 A | 6/1993 | Tsujimoto |
| 5,264,743 A | 11/1993 | Nakagome et al. |
| 5,276,843 A | 1/1994 | Tillinghast et al. |
| 5,307,315 A | 4/1994 | Oowaki et al. |
| 5,377,156 A | 12/1994 | Watanabe et al. |
| 5,394,077 A | 2/1995 | Atsumi |
| 5,396,116 A | 3/1995 | Watanabe et al. |
| 5,398,207 A | 3/1995 | Tsuchida et al. |
| 5,426,601 A | 6/1995 | Agata et al. |
| 5,499,209 A | 3/1996 | Oowaki et al. |
| 5,555,215 A | 9/1996 | Nakagome et al. |
| 5,592,421 A | 1/1997 | Kaneko et al. |
| 5,822,267 A | 10/1998 | Watanabe et al. |
| 6,125,075 A | 9/2000 | Watanabe et al. |
| 6,363,029 B1 | 3/2002 | Watanabe et al. |
| 6,624,680 B2 | 9/2003 | Schenck |
| 7,301,830 B2 * | 11/2007 | Takahashi et al. ........... 365/194 |
| 2002/0021159 A1 | 2/2002 | Takahashi |
| 2002/0033721 A1 | 3/2002 | Tachimori |

FOREIGN PATENT DOCUMENTS

| | | |
|---|---|---|
| JP | 2-214149 A | 8/1990 |
| JP | 3-237682 A | 10/1991 |
| JP | 3-273594 A | 12/1991 |
| JP | 4-038786 A | 2/1992 |
| JP | 4-078220 A | 3/1992 |
| JP | 5-334875 A | 12/1993 |
| JP | 6-282986 A | 10/1994 |
| JP | 7-240094 A | 9/1995 |
| JP | 2002-050945 A | 2/2002 |
| JP | 2002-124858 A | 4/2002 |
| JP | 8-340238 A | 12/2002 |

* cited by examiner

SEMICONDUCTOR MEMORY DEVICE AND SEMICONDUCTOR MEMORY DEVICE CONTROL METHOD

CROSS-REFERENCE TO RELATED PATENT APPLICATIONS

This application is a continuation of U.S. patent application Ser. No. 10/507,117, filed Sep. 10, 2004; which is a continuation of International Application No. PCT/JP03/02095, filed on Feb. 26, 2003, and claims priority to Japanese Patent Application No. 2002-72953, filed on Mar. 15, 2002, by Hiroyuki Takahashi, Takuya Hirota, and Atsushi Nakagawa, all of which are incorporated herein by reference in their entirety. This application claims only subject matter disclosed in the parent application and therefore presents no new matter.

FIELD OF THE INVENTION

The present invention relates to a semiconductor memory device. More specifically, the invention relates to a semiconductor memory device suitable for being driven by a low voltage power supply, and its control method.

BACKGROUND OF THE INVENTION

In recent years, reduction of a supply voltage for semiconductor integrated circuits has been pursued. In logic devices and memories mounted on portable devices and driven by batteries, in particular, lower power consumption (dissipation) is required.

In the semiconductor integrated circuit and the like, a delay circuit is employed so as to obtain signal timings required for operating respective circuits therein. On the other hand, in asynchronous, dynamic-type semiconductor memory devices that are not driven by an external clock signal, various timing signals are generated inside the semiconductor memory devices. More specifically, for various signals for controlling a memory core unit, a pulse signal is generated based on detection on a change in an address signal, a predetermined input signal, or the result of decoding of it, and a control signal in pulse form, which rises being delayed by a predetermined time and having a predetermined pulse width is generated from the pulse signal and its delayed signal.

As the background art of the present invention, an overview of an asynchronous dynamic RAM will be described below with reference to FIG. 6, which will be referred to in the embodiments of the present invention. Referring to FIG. 6, a peripheral circuit 10 controls driving of a word line driver 13 for driving a word line based on a signal indicating the result of operation by a logic circuit 12 that receives a signal supplied to a delay circuit 11 and the output of the delay circuit. A step up voltage (boost voltage) is supplied to a driving power supply of the word line driver 13 from a step-up converter (booster circuit 40). As the step-up voltage, a voltage obtained by adding a voltage exceeding a threshold voltage Vth of an NMOS transistor to a power supply voltage VDD is provided. It is noted that a reference voltage source 30 in FIG. 6 is specific to the embodiments in the present invention and is not included in the conventional dynamic RAM. In an NMOS transistor 203 of a memory cell 200 provided at an intersection between a word line and a bit line in a cell core unit 20, a high voltage not less than VDD+Vt is supplied to the gate connected to a selected word line 201 so that the output voltage of the NMOS transistor 203 can rise up to the power supply voltage VDD.

FIG. 7 is a diagram for explaining timing operations in the asynchronous dynamic RAM. When a transition in an address in memory cycle is detected by an ATD circuit not shown, an ATD signal is activated and then, a strobe signal $\phi p$ for activating a row address is generated based on this signal, the result of decoding the address signal, and a control signal not shown for controlling access to the memory. By a signal generated based on this signal $\phi p$ and its delayed signal, a word line rise timing and/or its pulse width are/is controlled. Likewise, a signal $\phi SE$ for controlling activation of a sense amplifier 14 for amplifying a signal read onto a bit line 16 or a Y switch enable signal not shown, a control signal for precharging the bit line to ½ VDD, and the like are generated.

As the delay circuit 11 of this type, an inverter-chain constituted by connecting a plurality of inverters in cascade, for example is employed. The number of the inverters constituting the delay circuit is set to an even when the delay circuit outputs a delayed signal in phase with the input signal, and the number of the inverters is even when the delay circuit outputs a delayed signal having a phase reversed from the input signal is output.

FIG. 15 shows a configuration example of a conventional delay circuit using a CMOS inverter-chain. As shown in FIG. 15A, the conventional delay circuit is constituted from a plurality of inverters JV1 to JV4 connected in cascade, and load capacitors constituted from MOS capacitors JN1 to JN4 are connected to respective outputs of the inverters. As shown in FIG. 15B, each inverter is constituted from an PMOS transistor MP301 having its source connected to a high-potential power supply VDD, an NMOS transistor MN301 having its gate and drain connected to the gate and drain of the PMOS transistor MP301 respectively, and having its source connected to a low potential power supply GND. When a signal input to common gates undergoes a transition from a low level to a high level, electric charge on the load capacitance connected to the common drain is discharged to the power supply GND through the NMOS transistor MN301 which is in an on state, so that its output goes low. When the signal input to the common gate undergoes a transition from the high level to the low level, the load capacitance connected to the common drains is charged from the power supply VDD through the PMOS transistor MP301 which is in an on state, so that the output of the inverter goes high. As described above, by charging and discharging the load capacitances of the outputs of the inverters, signal propagation is performed.

The fall tf and rise times (delays) tf and tr of a CMOS-type inverter (which are delay times required for 10 to 90% transition of an amplitude) are derived from formulas that depend on a load capacitance, power supply voltage, transconductance, and a ratio between the power supply voltage and its threshold value, based on a drain current-voltage characteristic in the nonsaturation region and the saturation region of a MOS transistor. The characteristic between drain-to-source current and voltage in the nonsaturation region is defined by gate-to-source voltage, drain-to-source voltage, threshold voltage, and transconductance, while the characteristic between drain-to-source current and voltage in the saturation region is defined by gate-to-source voltage, threshold voltage, and transconductance. Roughly, as is well known, the rise time tf and the fall time tr are approximated by:

$$tf = k1 \times CL/(\beta n \times VDD)$$

$$tr = k2 \times CL/(\beta p \times VDD)$$

where CL indicates the load capacitance, $\beta p$ and $\beta n$ indicate respective transconductances of the PMOS transistor and the NMOS transistor of the CMOS inverter, VDD indicates the supply voltage, and k1 and k2 are constants.

When the power supply voltage VDD is high, the rise time tr and the fall time tf of the inverter are both reduced, so that a propagation delay time tpd of the inverter decreases. The propagation delay time tpd includes a propagation delay time tpHL from rise of an input signal to fall of an inverted output signal and a propagation delay time tpLH from the fall of the input signal to the rise of the inverted output.

On the other hand, when the power supply voltage VDD is reduced, the rise time tr and the fall time tf of the inverter are both increase, so that the propagation delay time of the inverter increases.

Due to increases in delay times of the inverters JV1 to JV4 constituting the delay circuit in FIG. 15, the propagation delay time of the delay circuit also increases. Further, as in the delay circuit constituted from the inverter chain, the propagation delay time of other circuit as well decrease/increase due to elevation and lowering of an operation supply voltage. Thus, the operation speed of the device becomes fast or slow.

Recently, due to the demands in regard to a breakdown voltage with the progress in miniaturization of devices and for lower power consumption, a configuration in which the supply voltage of the semiconductor device is stepped down and internal circuits are operated at a low voltage is generally employed. In the dynamic-type semiconductor memory device as well, an internal power supply voltage VINT obtained by reducing the power supply voltage VDD supplied externally by a voltage step-down circuit is employed as the supply voltage for a peripheral circuit and a cell core section (which is also referred to as a "memory cell array"). However, the semiconductor memory device that uses the stepped-down supply voltage sometimes cannot accommodate the reduction of the power supply voltage VDD. It is because if the internal power supply voltage VINT obtained by further stepping down the reduced power supply voltage VDD is employed, the operation speed of the device becomes slow, thereby making an access time slow, so that it sometimes happens that functional specifications are not satisfied.

The conventional circuit shown in FIG. 15 also has a problem: when the power supply voltage VDD is reduced, the delay time increases more compared with an increase in the amount of the delay of an ordinary logic circuit, so that it sometimes happens that timing relationship among signals is not satisfied. This is caused by the following reason: since wiring connected to the output sections of the respective inverters is short, substantial wiring resistance is not present. Thus, the on resistance of each transistor is dominant as a resistive component which, together with the MOS capacitors, contributes to the time constant.

On contrast therewith, the signal line of the ordinary logic circuit is driven in a circuit configuration as shown in FIG. 16. Rise and fall of a signal line SL having a wiring resistance (parasitic resistance) R and a parasitic capacitance C is defined by the time constant stipulated by the parasitic resistance R of the signal line, the output resistance of a driver (output circuit) D, and the parasitic capacitance C of the signal line. In a circuit for driving a wiring having a wiring parasitic resistance as a load, the delay time of a signal is not so dependent on the power supply voltage as the inverter chain in FIG. 15.

Accordingly, the delay time of the delay circuit shown in FIG. 15 excessively increases when the supply voltage is reduced, on contrast with the ordinary logic circuit.

In order to solve the problem as described above, the inventor of the present application already proposed a delay circuit of a configuration as shown in FIG. 17 in the priority claim (US Patent Application Publication No. US 2002/0021159 A1) based on JP Patent Application No. 2001-097083. This delay circuit is the delay circuit of which the delay time does not excessively increase, compared with the ordinary logic circuit even if the supply voltage is reduced and can suppress the increase of the delay time.

Referring to FIG. 17, the delay circuit includes a plurality of inverters V11, V12, V13, and V14 connected in cascade. PMOS capacitors P11 and P12 are provided between the output of the inverter V11 and the high potential power supply VDD and the output of the inverter V13 and the high potential power supply VDD, respectively. NMOS capacitors N11 and N12 are provided between the output of the inverter V12 and the low potential power supply GND and the output of the inverter V14 and the low potential power supply GND, respectively.

The PMOS capacitors P11 and P12 become from an off state to the on state (inversion state) in response to falling transition of the outputs of the inverters V11 and V13 from the high level to the low level, respectively. The NMOS capacitors N11 and N12 become from the off state to the on state (inversion state) in response to rising transition of the outputs of the inverters V12 and V14 from the low level to the high level, respectively. As is well known, the NMOS capacitor is in an accumulation state when its gate voltage Vg is negative or a ground voltage GND (0V), and its capacitance value is constituted from a capacitance Co of a gate oxide film therein alone. When the gate voltage Vg is larger than 0, a depletion layer is formed in the surface of a substrate, so that its capacitance value becomes a capacitance C obtained by series synthesis of the gate oxide film capacitance Co and a capacitance Cd of the depletion layer formed in the surface of the substrate, which is smaller than Co. When the gate voltage Vg is positive and increases (Vg>Vt, in which Vt is the threshold voltage), an inversion layer resulting from polarity inversion of the surface of the p-type substrate is formed. If so-called strong inversion occurs, its capacitance value becomes closer to Co. Likewise, the PMOS capacitor is in the accumulation state when its gate voltage is the power supply voltage VDD. Then, when the gate voltage falls below the supply voltage and transitions toward the ground voltage GND, the PMOS capacitor becomes a depletion state and then an inversion state.

In the inverter chain shown in FIG. 17, assume that the power supply voltage VDD is reduced, the driving currents of the MOS transistors are reduced and then the on resistances of the MOS transistors constituting the inverters increase in appearance. Then, the capacitance values of the MOS capacitors relatively decrease. An increase in the amount of the delay is thereby suppressed. This delay circuit suppresses an excessive increase in the delay time due to lowering of the power supply voltage VDD, in response to rise (transition from GND to VDD) of an input SIN to the inverter V11 in the first stage.

The inventor of this application already proposed a delay circuit of a configuration as shown in FIG. 18 in JP Patent Application No. 2001-097083. This delay circuit is the delay circuit of which the delay time does not excessively increase and which can suppress an increase in the delay circuit, even if the supply voltage is reduced. Referring to FIG. 18, the threshold value of a PMOS transistor P81 of an inverter V81 is set to be high, and the threshold value of an NMOS transistor N81 of the inverter V81 is set to be low. The threshold value of a PMOS transistor P82 of an inverter V82 is set to be low and the threshold value of an NMOS transistor N82 of the inverter V82 is set to be high. The input threshold value of the inverter V81 tends to decrease as the power supply voltage is reduced, while the input threshold value of the inverter V82 tends to rise as the power supply voltage is reduced. The input threshold value of the delay circuit thereby decreases in a region in which the power supply voltage VDD is low, and the propagation delay time tpd from the rise of the input signal to the rise of the output signal becomes relatively shorter than the propagation delay time from the fall of the input signal to the fall of the output signal. As a result, the delay time in the rise of the signal can be reduced, so that dependency of this delay time on the power supply voltage is suppressed.

As described above, the delay circuits shown in FIGS. 17 and 18, respectively, suppress an excessive increase in the delay time caused by reduction of the power supply voltage VDD in the configuration as shown in FIG. 15. However, the delay circuits do not have a reverse sensitivity characteristic in which the delay time thereof decreases with reduction of the power supply voltage. For this reason, with respect to reduction of the power supply voltage of the semiconductor memory device, when edges and pulses of a control signal are generated for using the delay circuits shown in FIGS. 17 and 18, respectively, the delay of the control signal does not decrease as the power supply voltage is reduced. Thus, a constraint is imposed on the lower power consumption.

Accordingly, it is an object of the present invention to provide a semiconductor memory device in which by speeding up access to the cell core unit while reducing a power supply voltage for driving, reduction of a combined access speed to the cell core unit and the peripheral circuit caused by the reduced power supply voltage is suppressed, and its control method.

Still other object of the present invention is to provide a semiconductor device in which due to its simple configuration, an increase in the delay time caused by the reduction of the power supply voltage is further suppressed, so that the delay time shows a tendency of decreasing.

SUMMARY OF THE DISCLOSURE

A semiconductor memory device in accordance with one aspect of the present invention includes: a memory cell array having a plurality of memory cells arranged in an array from; and a word line driving circuit for receiving a constant voltage that does not depend on a power supply voltage as a driving voltage and driving a selected word line by the constant voltage. The higher voltage level of the amplitude of a selected bit line is amplified to the power supply voltage.

In the semiconductor memory device according to other aspect of the present invention, a peripheral circuit including a circuit for generating a signal for defining the transition timing of a control signal to the memory cell array and/or the pulse width of the control signal includes a delay circuit for delaying an input signal, and the delay circuit has a characteristic in which a delay time thereof decreases more when the provided power supply voltage is low than when the provided power supply voltage is high.

The delay circuit according to other aspect of the present invention includes: at least one circuit unit including: an inverter including a first MOS transistor with a source thereof connected to a first power supply and a second MOS transistor with a source thereof connected to a second power supply, the gate of the second MOS transistor and the gate of the first MOS transistor being connected in common to an input terminal, the drain of the second MOS transistor and the drain of the first MOS transistor being connected in common to an output terminal, the second MOS transistor having a different conductivity type from the conductivity type of the first MOS transistor; a resistor (resistance element) with one terminal thereof connected to the output terminal of the inverter; and a MOS capacitor connected between the other terminal of the resistor and the first or second power supply.

In the delay circuit according to the present invention, the capacitance value of the MOS capacitor increases when a voltage at the other terminal of the resistor transitions from the power supply voltage of one of the first and second power supplies to the power supply voltage of the other of the first and second power supplies. One terminal of the MOS capacitor is connected to the other terminal of the resistor and the other terminal of the MOS capacitor is connected to one of the first and second power supplies. In the present invention, a depletion layer or an inversion layer is formed in the MOS capacitor according to a transition of a voltage at the other terminal of the resistor from the power supply voltage of one of the first and second power supplies to the power supply voltage of the other of the first and second power supplies. The MOS capacitor is connected to one of the first and second power supplies.

In the delay circuit according to the present invention, the circuit unit is constituted from a plurality of stages of circuit units connected in cascade. The input signal is input to the input terminal of the inverter of the circuit unit in the first one of the stages. An output signal is taken from a connection point between the MOS capacitor and the other terminal of the resistor connected to the output terminal of the inverter in the circuit unit in the final one of the stages. MOS capacitors in the stages of the circuit units adjacent to each other are connected to the first power supply and the second power supply, alternately.

In one aspect of the present invention, the delay circuit is the delay circuit including one or more inverters connected in cascade, and each of the inverters includes: the resistor with the one terminal thereof connected to the output terminal of the each of the inverters; and a capacitance element connected between the other terminal of the resistance and a high potential power supply or a low potential power supply. The capacitance value of the capacitance element increases when a voltage at the other terminal of the resistance transitions from the power supply voltage of one of the high potential and low potential power supplies to the power supply voltage of the other of the high potential and low potential power supplies. One terminal of the capacitance element is connected to the other terminal of the resistor and the other terminal of the capacitance element is connected to one of the high potential and low potential power supplies.

In other aspect of the present invention, the delay circuit includes: a first inverter for inputting the input signal at an input terminal thereof; a first resistor with one terminal thereof connected to the output terminal of the first inverter; a first capacitance element with one terminal thereof and the other terminal thereof connected to the other terminal of the first resistor and the first power supply, respectively, the capacitance value of the first capacitance element changing according to a transition of a voltage at the one terminal thereof connected to the other terminal of the first resistor; a second inverter with an input terminal thereof connected to a connection point between the first resistor and the first capacitance element; a second resistor with one terminal thereof connected to the output terminal of the second inverter; and a second capacitance element with one terminal thereof and the other terminal thereof connected to the other terminal of the second resistor and the second power supply, respectively, the capacitance value of the second capacitance element changing according to a transition of a voltage at the one terminal thereof connected to the other terminal of the second resistor. A connection point between the second resistor and the second capacitance element is the output terminal of a delayed signal, and an in-phase output signal obtained by delaying the transition edge of the input signal is output from the output terminal. In the present invention, the capacitance value of the first capacitance element increases when the voltage at the one terminal thereof connected to the other terminal of the first resistor transitions from the power supply voltage of the first power supply to the power supply voltage of the second power supply, and the capacitance value of the second capacitance element increases when the voltage at the one terminal thereof connected to the other terminal of the second resistor transitions from the power supply voltage of the second power supply to the power supply voltage of the first power supply. In the present invention, preferably, the first capacitance element is constituted from the MOS capacitor. The MOS capacitor constituting the first capacitance element changes to an inversion state when the voltage at the other terminal of the first resistor transitions from the power supply voltage of the first power supply to the power supply voltage of the second power supply. Preferably, the second capacitance element is constituted from the MOS capacitor. The MOS capacitor constituting the second capacitance element changes to an inversion state when the voltage at the other terminal of the second resistor transitions from the power supply voltage of the second power supply to the power supply voltage of the first power supply.

The delay circuit according to other aspect of the present invention may further include: a third capacitance element with one terminal thereof and the other terminal thereof connected to the other terminal of the first resistor and the second power supply, respectively, the capacitance value of the third capacitance element changing according to a transition of a voltage at the one terminal thereof connected to the other terminal of the first resistor; and a fourth capacitance element with one terminal thereof and the other terminal thereof connected to the other terminal of the second resistor and the first power supply, respectively, the capacitance value of the fourth capacitance element changing according to a transition of a voltage at the one terminal thereof connected to the other terminal of the second resistor. In the present invention, the capacitance value of the third capacitance element increases when the voltage at the one terminal thereof connected to the other terminal of the first resistor transitions from the power supply voltage of the second power supply to the power supply voltage of the first power supply. The capacitance value of the fourth capacitance element increases when the voltage at the one terminal thereof connected to the other terminal of the second resistor transitions from the power supply voltage of the first power supply to the power supply voltage of the second power supply. In the delay circuit according to the present invention, preferably, the third capacitance element is constituted from the MOS capacitor, and the MOS capacitor constituting the third capacitance element changes to an inversion state when the voltage at the other terminal of the first resistor transitions from the power supply voltage of the second power supply to the power supply voltage of the first power supply. Preferably, the fourth capacitance element is constituted from the MOS capacitor, and the MOS capacitor constituting the fourth capacitance element changes to an inversion state when the voltage at the other terminal of the second resistor transitions from the power supply voltage of the first power supply to the power supply voltage of the second power supply.

The delay circuit according to the present invention may include a reset circuit having a first switch inserted between the first power supply and the other terminal of the first resistor and with a control terminal thereof connected to the input terminal of the first inverter. Alternatively, the delay circuit according to the present invention may include the reset circuit having a third inverter with an input terminal thereof connected to the input terminal of the first inverter and a second switch inserted between the other terminal of the second resistor and the second power supply and with the control terminal thereof connected to the output terminal of the third inverter.

The delay circuit according to other aspect of the present invention further includes a third capacitance and a fourth capacitance. The third capacitance is connected between the other terminal of the first resistor and the second power supply, and the capacitance value of the third capacitance increases when the voltage at the other terminal of the first resistor transitions from the power supply voltage of the second power supply to the power supply voltage of the first power supply. The fourth capacitance is connected between the other terminal of the second resistor and the first power supply, and the capacitance value of the fourth capacitance increases when the voltage at the other terminal of the second resistor transitions from the power supply voltage of the first power supply to the power supply voltage of the second power supply. In the present invention, the third capacitance element is constituted from the MOS capacitor. The third capacitance changes to an inversion state when the voltage at the other terminal of the first resistor transitions from the power supply voltage of the second power supply to the power supply voltage of the first power supply. The fourth capacitance element is constituted from the MOS capacitor, and the fourth capacitance changes to an inversion state when the voltage at the other terminal of the second resistor transitions from the power supply voltage of the first power supply to the power supply voltage of the second power supply.

In the semiconductor memory device according to other aspect of the present invention, the peripheral circuit for generating the signal for defining the transition timing of the control signal to the memory cell array and/or the pulse width of the control signal includes the delay circuit for delaying the input signal, and as the delay circuit, the delay circuit according to one of the aspects of the invention described above is provided.

The semiconductor memory device of the present invention includes a circuit for supplying a constant voltage that does not depend on the power supply voltage as a boosted voltage to be supplied to the control line of the memory cell array. In the semiconductor memory device according to the present invention, the memory cell array, the delay circuit, and the peripheral circuit are driven by the relatively low voltage power supply. Alternatively, the memory cell array and the delay circuit may be driven by the low voltage power supply obtained by stepping down the power supply voltage, and the peripheral circuit may be driven by the power supply voltage.

In a method according to other aspect of the present invention for delaying the transition edge of a logic signal by the inverter comprising one or more inverters connected in cascade, one terminal of the resistor is connected to the output terminal of each of the one or more inverters, and the other terminal of the resistor is connected to the power supply through the MOS capacitor, and the method includes:

(a) a step of inputting a rising or falling transition signal to the input terminal of one of the one or more inverters through an input terminal or the other terminal of the resistor with the one terminal thereof connected to the output terminal of the inverter at a preceding stage; and (b) a step of the MOS capacitor being changed to an inversion state when the output signal of the each of the one or more inverters transitions from one logic value to the other logic value, the one logic value corresponding to the power supply with the MOS capacitor connected thereto, the MOS capacitor corresponding to the each of the one or more inverters to which the transition signal has been input.

The method of controlling a semiconductor memory device according to other aspect of the present invention includes: driving the memory cell array and a peripheral circuit thereof by the relatively low voltage power supply; supplying the constant voltage that does not depend on the power supply voltage as a boosted voltage to be supplied to a control signal for the memory cell array; and performing signal delay using a delay circuit having a characteristic in which a delay time thereof decreases with reduction of the power supply voltage, by a circuit for generating the signal for defining the transition timing and/or the pulse width of a control signal supplied from the peripheral circuit to the memory cell array.

As clear from the following description, at least one of the problems described above is likewise solved by the inventions as set forth in respective claims as well.

PREFERRED EMBODIMENTS OF THE INVENTION

Figure 1:
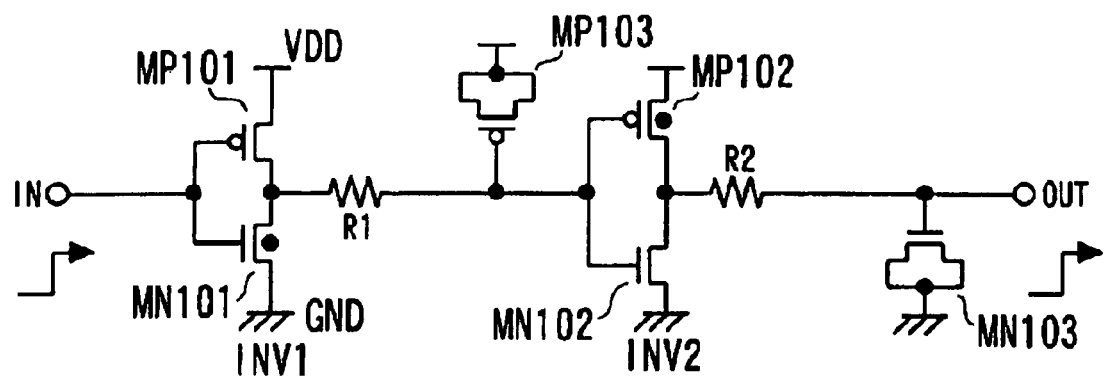
FIG. 1 is a diagram showing a configuration of a delay circuit according to an embodiment of the present invention.

The preferred embodiments of the present invention will be described with reference to the drawings. A semiconductor device according to a preferred embodiment of the present invention includes a memory cell array (a cell core unit 20 in FIG. 6) in which a plurality of memory cells are arranged in an array form and a word line driving circuit (indicated by reference numeral 13 in FIG. 6) for inputting a constant voltage that does not depend on a provided power supply voltage as a boosted voltage (VBOOST) and driving a selected word line by the constant voltage. The higher voltage level of the amplitude of the selected bit line (indicated by reference numeral 16 in FIG. 6) is the power supply voltage (VDD).

In the present embodiment mode, a sense amplifier (indicated by reference numeral 14 in FIG. 6) amplifies the high potential side of the selected bit line to the power supply voltage. In the semiconductor memory device in its preferred embodiment of the present invention, a peripheral circuit including a circuit for generating a signal for defining the transition timing of a control signal to the memory cell array (the cell core unit 20 in FIG. 6) and/or the pulse width of the control signal has a delay circuit (indicated by reference numeral 11 in FIG. 6). The delay circuit has a characteristic in which its delay time decreases more when the power supply voltage provided to the delay circuit is low than when the power supply voltage is high (refer to FIG. 11).

Figure 6:
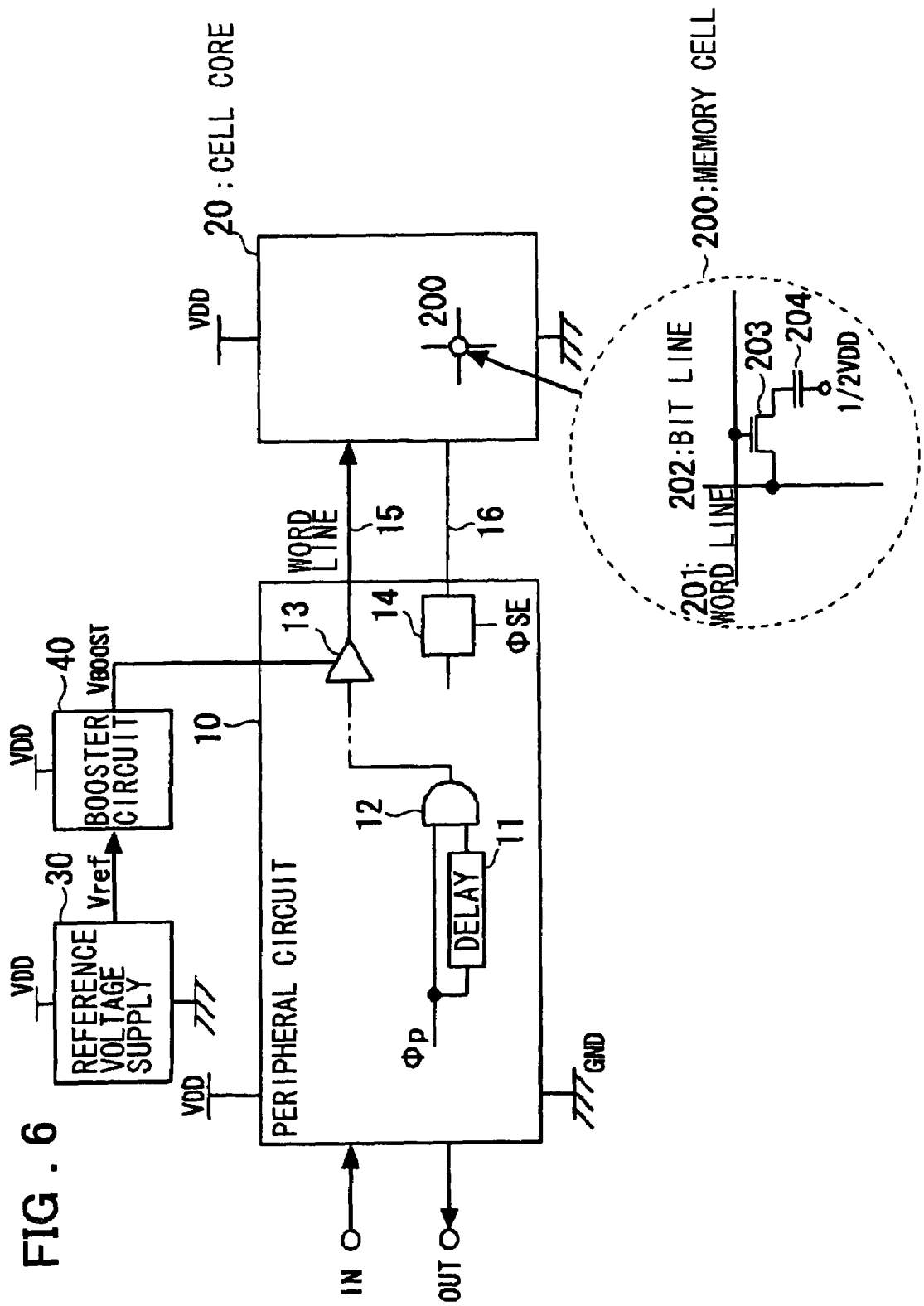
FIG. 6 is a diagram showing a configuration of a semiconductor memory device according to an embodiment of the present invention.

In the semiconductor memory device according to the embodiment of the present invention, at the time of low voltage driving using the relatively low voltage power supply (VDD), the constant voltage (VBOOST) is constant irrespective of the power supply voltage (VDD), and a delay time (tpd) of the control signal is reduced more at the time of the low voltage driving than at the time of high voltage driving using the relatively high power supply voltage (VDD) due to the characteristic of the delay circuit (indicated by reference numeral 11 in FIG. 6). Thus a control mechanism is implemented in which an access time of the memory cell array (cell core unit) is reduced more than in the case of the high voltage driving, and the amount of this reduction (or a difference) cancels out at least part of an increase in the access time due to reduction of the operation speed of the peripheral circuit of the memory cell array caused by the low voltage driving, so that an increase in the delay of the overall access time of the memory cell array and the peripheral circuit at the time of the low voltage driving is suppressed.

Referring to FIG. 1, the delay circuit in the embodiment of the present invention has one or more delay circuit units each including a CMOS inverter (such as INV1) and a resistor (such as R1), and a MOS capacitor (such as MP203). The CMOS inverter includes a first MOS transistor and a second MOS transistor. The source of the first MOS transistor is connected to a first power supply. The source of the second MOS transistor is connected to a second power supply. The gate of the second MOS transistor and the gate of the first MOS transistor are connected in common to an input terminal. The drain of the second MOS transistor and the drain of the first MOS transistor are connected in common to an output terminal. The second MOS transistor has a conductivity type different from that of the first MOS transistor. One terminal of the resistor is connected to the output terminal of the inverter. The MOS capacitor (such as MP103) is connected between the other terminal of the resistor and the first or second power supply (VDD or GND). In case an input signal is to be output in-phase and delayed according to a desired delay time, the delay circuit includes an even number of the delay circuit units connected in cascade. In case the input signal is to be output in the reverse phase and delayed, the delay circuit includes an odd number of the delay circuit units connected in cascade.

When the gate voltage of the MOS capacitor (MP103 or MN103) is the power supply voltage (VDD or GND) to which the MOS capacitor is connected, the MOS capacitor is in an accumulation state. According to a transition of the gate voltage from one power supply voltage (VDD or GND) to the other power supply voltage (GND or VDD) to which the MOS capacitor (such as MP103 or MN103) is connected, a depletion layer or an inversion layer is formed in the surface of a substrate. That is, the MOS capacitor becomes a depletion state or an inversion state.

According to the embodiment of the present invention, one terminal of the resistor is connected to the output terminal of the inverter, and a capacitance element with a capacitance value thereof increasing in response to a transition of the output of the inverter from the one power supply voltage to the other power supply voltage is provided between the other terminal of the resistor and the power supply voltage. The effect of allowing suppression and further reduction of an increase in its delay time with respect to reduction of the power supply voltage (the reverse sensitivity characteristic of power supply voltage dependency) is thereby achieved.

The embodiment of the present invention includes at least a first CMOS inverter (INV1), a first resistor (R1), a first capacitance, a second CMOS inverter (INV2), a second resistor (R2), and a second capacitance. The first CMOS inverter (INV1) inputs an input signal at an input terminal thereof. One terminal of the first resistor (R1) is connected to the output terminal of the first inverter. The first capacitance is constituted from a MOS capacitor (MP103) connected between the other terminal of the first resistor (R1) and the first power supply (VDD). The input terminal of the second CMOS inverter (INV2) is connected to a connection point between the first resistor (R1) and the first capacitance. One terminal of the second resistor (R2) is connected to the output terminal of the second inverter (INV2). The second capacitance is constituted from a MOS capacitor (MN103) connected between the other terminal of the second resistor (R2) and the second power supply (GND). A connection point between the second resistor (R2) and the second capacitance (MN103) is an output terminal (OUT) for a delayed signal. A signal with the transition edge of the input signal delayed is output from the output terminal.

In the present embodiment, the threshold values of a MOS transistor (MN101) of the first inverter (INV1) and a MOS transistor (MP102) of the second inverter (INV2) in the delay circuit for delaying a rising edge for output are set to be low.

In the present embodiment, there is preferably provided a circuit for resetting the output nodes of the inverters in a delay path through a reset path different from the delay path without passage through the delay path. More specifically, referring to FIG. 2, a first switch (MP104) having a control terminal thereof connected to an input terminal (IN) of the first inverter (INV1) and connected between the first power supply and the other terminal of the first resistor (R1) is provided. There are provided a third inverter (INV01) having an input terminal thereof connected to the input terminal (IN) of the first inverter (INV1) and a second switch (MN104) connected between the other terminal of the second resistor (R2) and the second power supply (GND) and having a control terminal thereof connected to the output terminal of the third inverter (INV01).

Figure 4:
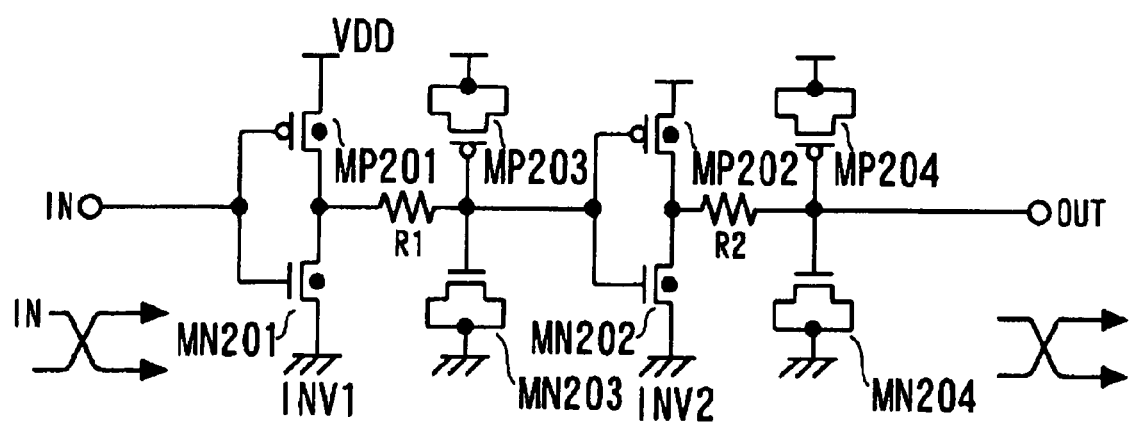
FIG. 4 is a diagram showing a configuration of a delay circuit according to a third embodiment of the present invention.

Referring to FIG. 4, other embodiment of the present invention may include a MOS capacitor (MP203) connected between the other terminal of the first resistor (R1) and the first power supply (VDD), a MOS capacitor (MN203) connected between the other terminal of the first resistor (R1) and the second power supply (GND), a MOS capacitor (MP204) connected between the other terminal of the second resistor (R2) and the first power supply (VDD), and a MOS capacitor (MN204) connected between the other terminal of the second resistor (R2) and the second power supply (GND). With this arrangement, the delay time has the reverse sensitivity characteristic of power supply dependency with respect to rise and fall transitions.

Figure 5:
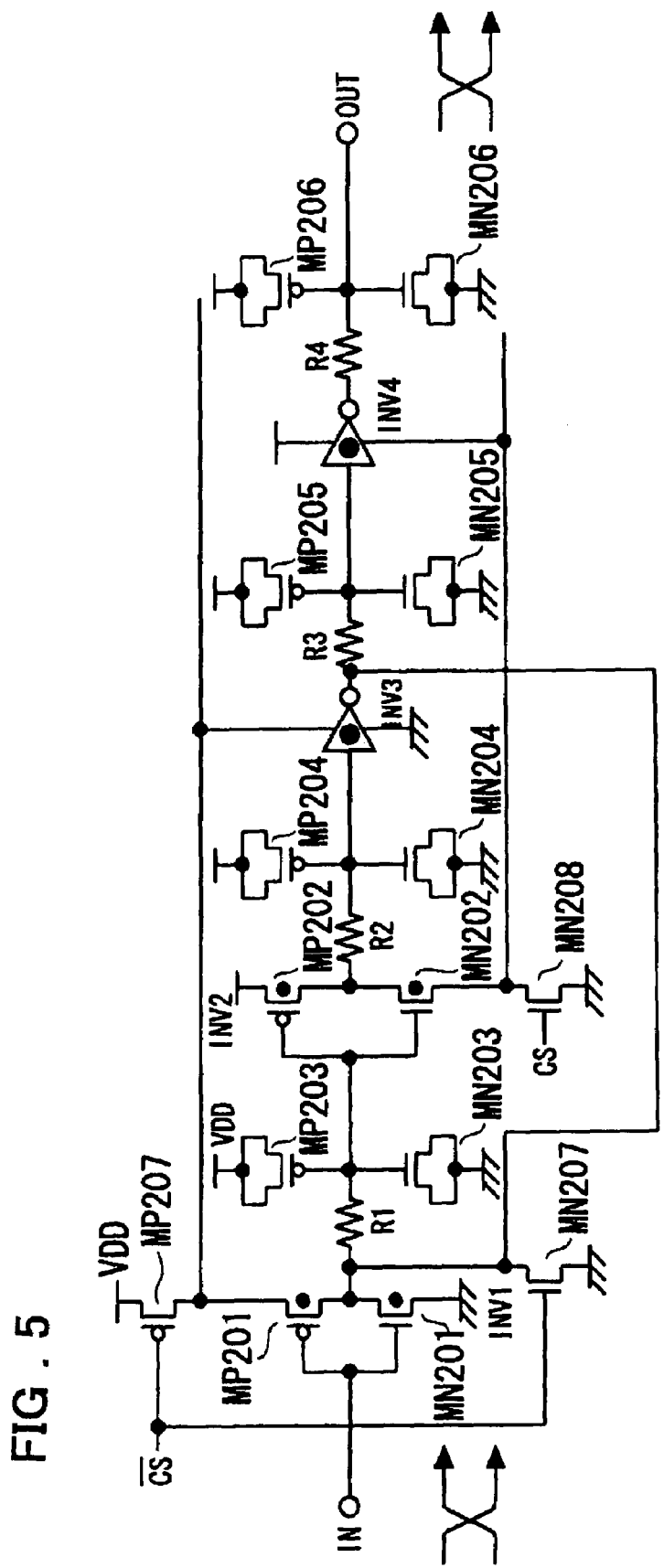
FIG. 5 is a diagram showing a configuration of a delay circuit according to a fourth embodiment of the present invention.

This embodiment may also include the reset circuit. Referring to FIG. 5, for example, a third switch (MP207) connected between the first power supply and the power supply terminal of the first inverter (INV1)(source of a PMOS transistor MP201), which turns on when a control signal for reset (CS) indicates a first logic value, a fourth switch (MN207) connected between the output terminal of the first inverter (INV1) and the second power supply (GND), which turns on when the control signal (CS) indicates a second logic value, and a fifth switch (MN208) connected between the power supply terminal of the second inverter (INV2) (source of the NMOS transistor MN202), which turns on when the control signal (CS) indicates the first logic value are provided.

In the present embodiment, the resistors (such as the first resistor (R1) and the second resistor (R2)) connected to the output terminals of the CMOS inverters are constituted from diffusion resistances on the substrate.

In the semiconductor memory device in its preferred embodiment of the present invention, the delay circuit described in the above embodiments, which has the reverse characteristic in terms of the power supply voltage dependency of the delay time is employed as the delay circuit (indicated by reference numeral 11 in FIG. 6) for generating a signal for defining the transition edge timing or the pulse width of the control signal supplied from the peripheral circuit to a memory cell.

In the semiconductor memory device of the present invention in its preferred embodiment, the power supply voltage VDD for the peripheral circuit including at least one of an X decoder, a Y switch selector, a sense amplifier, and the like is reduced, and the cell core unit (memory cell array) is also driven by the reduced power supply voltage VDD, thereby effecting lower power consumption. As the voltage (boosted voltage VBOOST) of a control signal supplied to the cell core unit, the constant voltage that does not depend on the power supply voltage is supplied. In the semiconductor memory device in its preferred embodiment of the present invention, the delay circuit for generating the signal for defining the transition edge timing of the control signal supplied from the peripheral circuit to a memory cell and its pulse width is driven by the low voltage power supply.

In the semiconductor memory device in its preferred embodiment of the present invention, by the control signal of which the transition edge or the like is defined by the signal generated by the delay circuit (11), signals for controlling activation of the word line driver for the X decoder and the sense amplifier and a signal for controlling precharging of a bit line are generated. For this reason, even if the peripheral circuit is driven by the low voltage power supply, the delay time of the control signal is not increased compared with driving by the high power supply voltage. Reduction of an access speed (increase in the delay) is thereby suppressed.

Figure 8:
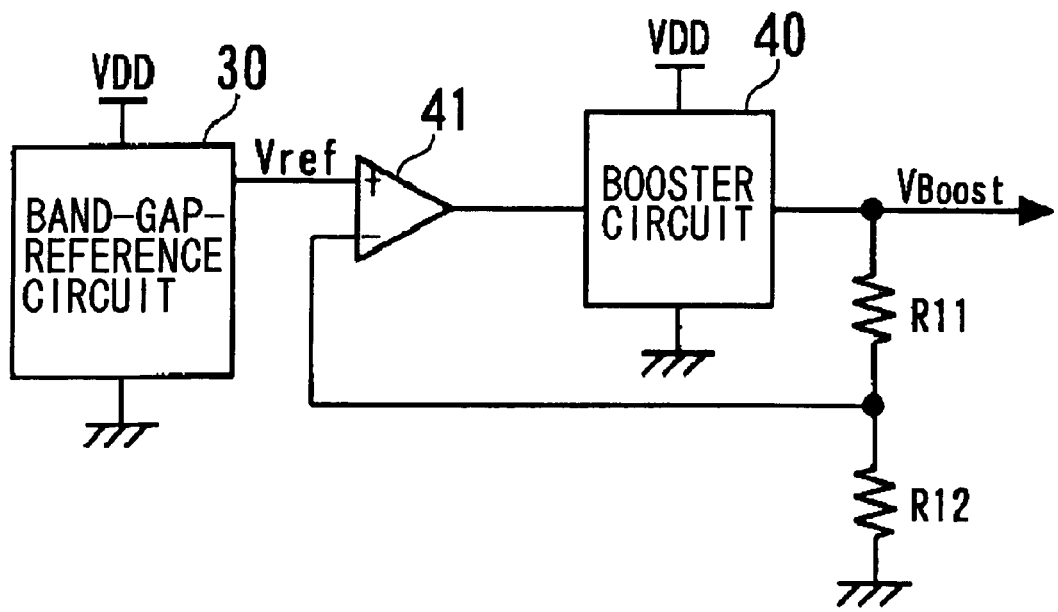
FIG. 8 is a diagram showing a configuration example of a boosted voltage generation circuit of the semiconductor memory device according to the embodiment of the present invention.

In the present embodiment, referring to FIG. 8, a circuit for generating the constant boosted voltage (VBOOST) that does not depend on the power supply voltage includes a circuit (30) for generating a reference voltage Vref that does not depend on the power supply voltage, a comparison circuit (41) for comparing the reference voltage with a divided voltage obtained by voltage-dividing an output boosted voltage, and a step-up converter circuit (40) for receiving the result of comparison and charging a charge pump and performing voltage boosting when it is indicated that the divided voltage is smaller than the reference voltage. The boosted voltage (VBOOST) is supplied as the power supply voltage of the word line driver, and the boosted voltage is supplied to a selected word line. Even when the power supply voltage is reduced, the boosted voltage supplied to the word line is kept to be the same as the boosted voltage when the power supply voltage is high, and reduction of the access speed to a memory cell due to reduction of the power supply voltage is suppressed.

The peripheral circuit in the memory cell array according to the present invention includes the delay circuit having the reverse sensitivity characteristic with respect to the delay time described above, for example, as the delay circuit driven by the power supply voltage (VDD) supplied to the semiconductor memory device, for generating the signal for defining the delay time of the transition timing of the control signal or the pulse width of the control signal supplied from the peripheral circuit to the memory cell array. The delay circuit (indicated by reference numeral 11A in FIG. 14) is driven by a stepped-down power supply voltage obtained by stepping down the power supply voltage (VDD) supplied to the semiconductor memory device by a voltage step-down circuit (indicated by reference numeral 50 in FIG. 14). This embodiment as well includes a booster circuit (indicated by reference numeral 40 in FIG. 14) for supplying the constant voltage that does not depend on the power supply voltage as the boosted voltage to be supplied to the memory cell array, based on the reference voltage that does not depend on the power supply voltage. The memory cell array (cell core unit 20) is driven by a stepped-down power supply voltage obtained by stepping down the power supply voltage provided to the semiconductor memory device by the voltage step-down circuit (indicated by reference numeral 50 in FIG. 14).

A delay method according to an embodiment of the present invention is the delay method for delaying the transition edge of a logic signal using one or more inverters connected in cascade. In the circuit configuration in which one terminal of the resistor (indicated by reference numeral R1 or R2 in FIG. 1) is connected to the output terminal of one of the one or more inverters and the other terminal of the resistor is connected to the power supply (VDD or GND) through the MOS capacitor (MP103 or MN103 in FIG. 1), the method includes:

(a) a first step of a rising or falling transition signal (transient signal) being supplied to an input terminal of one of the one or more inverters through an input terminal or the other terminal of the resistor with the one terminal connected to the output terminal of the inverter at a preceding stage; and (b) a second step of the MOS capacitor (indicated by reference numeral MP103 or MN103 in FIG. 1) being changed to an inversion state when the output signal of one of the one or more inverters transitions from one logic value to the other logic value, the one logic value corresponding to the power supply with the MOS capacitor connected thereto, the MOS capacitor corresponding to one of the one or more inverters to which the transition signal has been input.

In the method of controlling a semiconductor memory device according to the embodiment of the present invention, the peripheral circuit (indicated by reference numeral 10 in FIG. 6) including the X decoder, Y switch selector, and sense amplifier is driven by the low voltage power supply. The constant voltage that does not depend on the power supply voltage is supplied as the boosted voltage to be supplied to the memory cell array (indicated by reference numeral 20 in FIG. 6). Then, signal delay by the delay circuit (indicated by reference numeral 11 in FIG. 6) for generation of the pulse signal supplied from the peripheral circuit to a memory cell is performed using the delay method described above.

In a method of controlling a semiconductor memory device according to other embodiment of the present invention, the peripheral circuit is driven by the power supply voltage, and the delay circuit is driven by the stepped-down power supply voltage obtained by stepping down the power supply voltage. The constant voltage that does not depend on the power supply voltage is provided as the boosted voltage to be supplied to the memory cell array. The memory cell array is driven by the stepped-down power supply voltage obtained by stepping down the power supply voltage, and signal delay by the delay circuit (indicated by reference numeral 11 in FIG. 6) for generation of the pulse signal supplied from the peripheral circuit to a memory cell is performed by the delay method described above. Then, the delay circuit is driven by the stepped-down power supply voltage obtained by the stepping down the power supply voltage.

As described above, the semiconductor memory device according to the embodiments of the present invention can achieve the noticeable effect of allowing optimization of a driving power supply (thus power consumption) and an access time in response to the demand for lower power consumption such as speeding up of accesses and reduction of a standby current. The semiconductor memory device according to the embodiments of the present invention avoids an excessive increase in the access time while driving both of the peripheral circuit and the cell core unit by the low voltage power supply, for example. Alternatively, by driving the peripheral circuit by the high power supply voltage and driving the cell core unit by the low voltage power supply, the semiconductor memory device according to the embodiments of the present invention can effect both of speeding up of accesses and suppression of an increase in power consumption.

EMBODIMENTS

Embodiments of the present invention will be described below with reference to the drawings so as to describe the above-mentioned embodiments of the present invention in further detail. FIG. 1 is a diagram showing a configuration of a delay circuit according to an embodiment (a first embodiment) of the present invention.

Referring to FIG. 1, the delay circuit according to the first embodiment includes a CMOS-type first inverter INV1 and a MOS capacitor as a first stage circuit. The CMOS-type first inverter is constituted from a P-channel MOS transistor MP101 with a source thereof connected to a high potential power supply VDD, and an NMOS transistor MN101. The source of the NMOS transistor MN101 is connected to a low potential power supply GND. The gate of the NMOS transistor MN101 and the gate of the PMOS transistor MP101 are connected in common to an input terminal IN. The drain of the NMOS transistor MN101 and the drain of the PMOS transistor MP101 are connected in common to one terminal of a resistor R1. The MOS capacitor is constituted from a PMOS transistor MP103 connected between the other terminal of the resistor R1 and the power supply VDD. The gate of this PMOS transistor MP103 is connected to the other terminal of the resistor R1, and the source and drain of the PMOS transistor MP103 are connected to the power supply voltage VDD, which is also the substrate gate potential of this PMOS transistor.

As a second stage circuit, a CMOS-type second inverter INV2 and a MOS capacitor are provided. The CMOS-type second inverter INV2 is constituted from a PMOS transistor MP102 and an NMOS transistor MN102. The source of the PMOS transistor MP102 is connected to the power supply VDD. The NMOS transistor has its source connected to the power supply GND. The gates of the NMOS transistor MN102 and the PMOS transistor MP102 are connected in common to a connection point between the gate of the MOS transistor MP103 and the resistor R1. The drains of the NMOS transistor MN102 and the PMOS transistor MP102 are connected in common to one terminal of a resistor R2. The MOS capacitor is constituted from an NMOS transistor MN103 connected between the other terminal of the resistor R2 and the power supply GND. The gate of this NMOS transistor MN103 is connected to the other terminal of the resistor R2, and the source and the drain of the NMOS transistor MN103 are connected to the ground power supply GND, which is also the substrate gate potential of this NMOS transistor.

In the delay circuit according to the first embodiment of the present invention, the first inverter INV1 receives as an input a signal supplied to the input terminal IN and outputs the inverted signal of the input signal, and the second inverter INV2 receives as an input the output of the first inverter INV1 and outputs the inverted signal of the input signal. Then, an in-phase signal which is input to the input terminal IN and delayed is output from an output terminal OUT. Although FIG. 1 shows two stages of inverters, four stages or six stages may be employed. On the other hand, when the delay circuit outputs a signal having a phase opposite to that of the signal input to the input terminal IN, the delay circuit is constituted from an odd number of stages of inverters.

Figure 17:
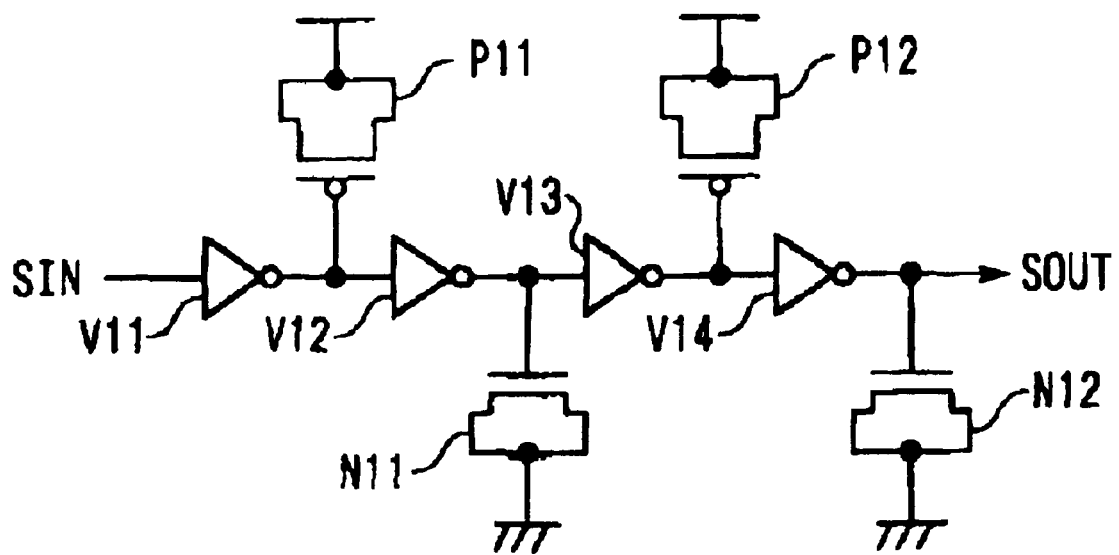
FIG. 17 is a diagram showing an example of a delay circuit proposed in JP Patent Application No. 2001-097083.

An operation of the delay circuit according to the first embodiment of the present invention will be described below. The circuit including the first inverter INV1 constituted from the transistors MP101 and MN101, MOS capacitor MP103, second inverter INV2 constituted from the transistors MP102 and MN102, and the MOS capacitor MN103 corresponds to the configuration shown in FIG. 17.

The MOS capacitors MP103 and MN103 become from an offstate to an on state (inversion state) in response to transition of the output of the inverter INV1 from the power supply voltage VDD to the ground voltage GND and transition of the output of the inverter INV2 from the ground voltage GND to the power supply voltage VDD, respectively. More specifically, during fall transition of the output signal voltage of the inverter INV1 from the power supply potential to the ground voltage, a depletion layer or an inversion layer are formed in the substrate surface of the MOS capacitor MP103, so that its capacitance value increases with reduction of the output signal voltage of the inverter INV1. When a gate voltage Vg of the MOS capacitor becomes about several times its threshold voltage Vt, the capacitance value of the MOS capacitor becomes close to the capacitance value of a gate insulation film (capacitance in an accumulation state) due to the C-V characteristic of a typical MOS capacitor.

When the output signal voltage of the inverter INV1 has slightly fallen from the power supply voltage VDD, and in the process of transition in which the output signal voltage of the inverter INV1 falls from the power supply voltage VDD to a threshold voltage Vtph of the PMOS capacitor MP103 or less, or equal or less than VDD−|Vtph|, the time constant value of a CR circuit (constituted from the resistor R1 and the MOS capacitor MP103) including the MOS capacitor MP103 on a delay path changes and gradually increases.

On the other hand, during rising transition of the output signal voltage of the inverter INV2 from the ground voltage to the power supply voltage, the inversion layer is formed in the substrate surface of the NMOS capacitor MN103, and its capacitance value increases with an increase in the output signal voltage of the inverter INV2. The time constant value of a CR circuit (constituted from the resistor R2 and the MOS capacitor MN103) including the NMOS capacitor MN103 on the delay path gradually increases, not being time invariant when the output signal voltage of the inverter INV2 has slightly risen from the ground voltage GND, and in the process of transition in which the output signal voltage of the inverter INV2 rises, exceeding a threshold voltage Vthn of the NMOS capacitor MN103.

Figure 19:
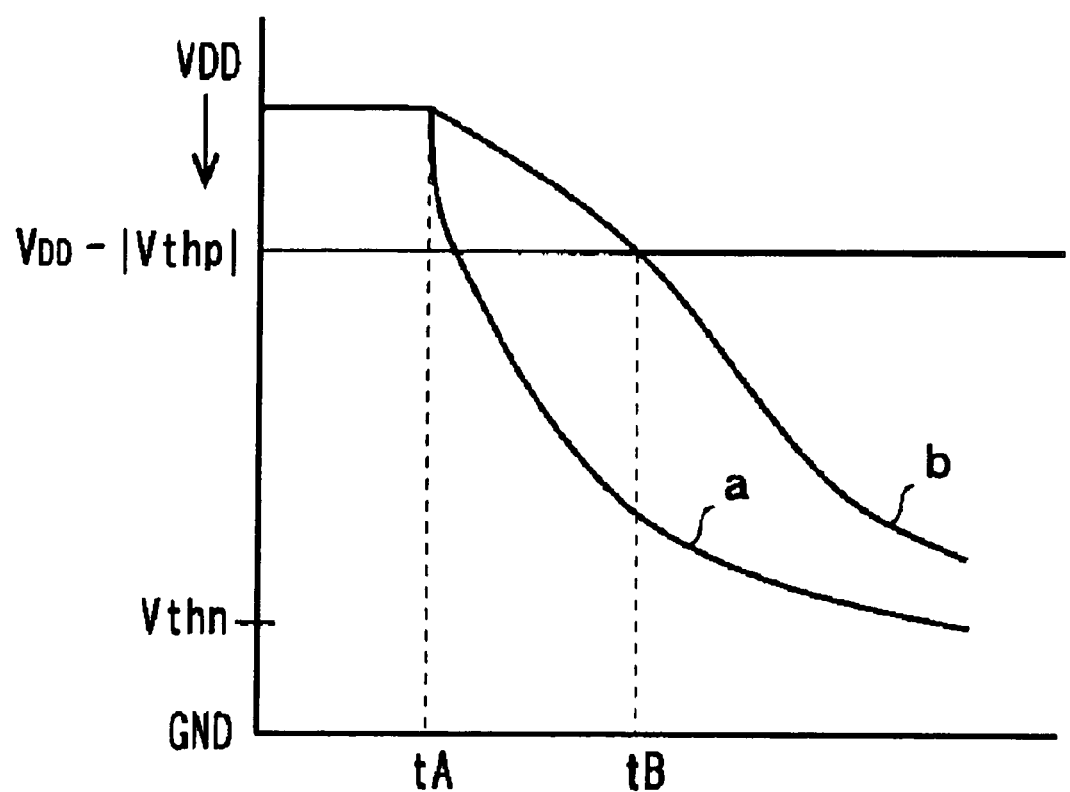
FIG. 19 is a graph explaining a difference in operation principle between the delay circuit shown in FIG. 1 and the delay circuit in FIG. 15.

More specifically, in the first embodiment of the present invention, referring to the falling waveform of the output signal of the inverter INV1, as indicated by a in FIG. 19, the capacitance value of the PMOS capacitor MP103 is small at the beginning of the falling transition. Thus, its time constant is small, and the ratio of decrease of its amplitude value with respect to a change in time is large. When the output signal voltage of the inverter INV1 becomes close to the ground voltage, the capacitance value increases, and the ratio of decrease of its amplitude value with respect to the change in time is reduced (the waveform becomes blunt). This FIG. 19 is a graph for comparing the falling waveform of the inverter in the delay circuit of the present invention with the falling waveform of the inverter the conventional configuration in FIG. 15, for explanation. The horizontal axis indicates time, while the vertical axis indicates voltage.

Referring to FIG. 1, as the delay path at the time of the fall of the output signal of the inverter INV1, the NMOS transistor MN101 of the inverter INV1 is turned on, and at the other terminal (gate terminal) of the capacitance element (PMOS capacitor MP103) with its one terminal connected to the power supply VDD, negative electric charge (−Q) is accumulated from the power supply GND through the resistor R1. At the terminal of the power supply VDD, electric charge (+Q) is accumulated. One terminal of the capacitance element (PMOS capacitor MP103) is brought to the power supply voltage VDD. When the capacitance value of the capacitance element is indicated by C (being substantially time invariant in this case), the terminal voltage of the other terminal (gate terminal) is indicated by V, and the value of the current that flows through the NMOS transistor MN101 is indicated by I, we have:

$$+Q=C\times(VDD-V)$$

Using V=R1×I, and dQ/dt=I, the above equation is formulated as:

$$R1\times C(dV/dt)+V=0,$$

where when t=0, V=VDD.

Thus, the falling waveform of the other terminal of the capacitance element (gate terminal of the PMOS capacitor MP103) is determined by:

$$V=VDD\times\exp\{-t/(R1\times C)\}.$$

In the present embodiment, the stray capacitor between the output terminal of the inverter INV1 and the ground power supply GND is ignored.

Referring to the rising waveform of the output signal of the inverter INV2, its time constant is small, and the ratio of increase of its amplitude value with respect to a change in time is large (with the slope being large) at the beginning of the transition. When the output signal voltage of the inverter INV2 becomes close to the power supply voltage VDD, the capacitance value and thus the time constant increases, and the ratio of increase of its amplitude value with respect to the change in time is reduced (the waveform becomes blunt).

Figure 15A:
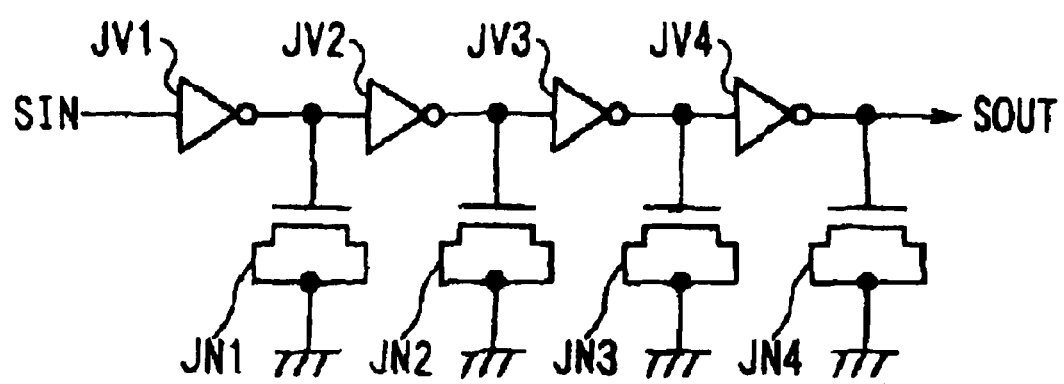
FIGS. 15A and 15B include diagrams showing a configuration example of the conventional delay circuit.
Figure 15B:
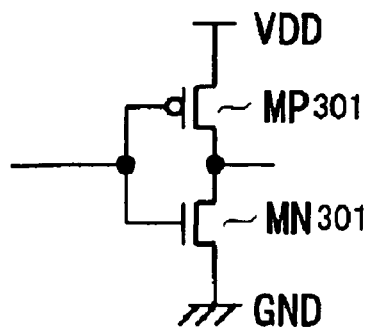
Figure 16:
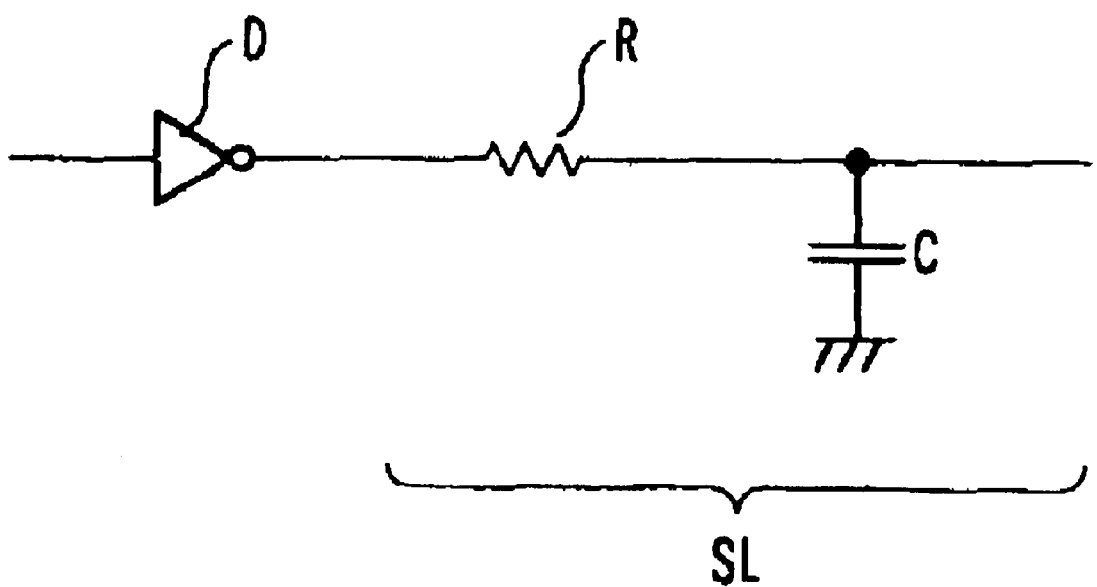
FIG. 16 is a diagram schematically showing a driving circuit constituted from a wiring resistance and a parasitic capacitance, for driving a signal line.

Compared with the configuration shown in FIG. 1, in the case of the configuration in FIG. 15, in response to the falling transition of the output signal voltage of the inverter JV1 from the power supply potential VDD to the ground voltage, the gate voltage of the MOS capacitor JN1 transitions from the power supply potential to the ground potential. Then, the MOS capacitor JN1 changes from the inversion state to the depletion state, and its capacitance value decreases with reduction of the output signal voltage of the inverter JV1. The falling waveform of the output signal of the inverter JV1, as indicated by b in FIG. 19, has a large time constant at the beginning of the transition. Thus, the slope of the waveform is gentle, and as the output signal voltage of the inverter JV1 becomes close to the ground voltage GND, the capacitance value becomes smaller, and the ratio of the decrease of its amplitude value with respect to the change in time increases.

In the first embodiment of the present invention, the time constant at the start of transition of the falling waveform of the output signal of the inverter INV1 is smaller than in the end of the transition, and the slope of the transition is sharp. Thus, a time tA (refer to FIG. 19) required for falling to the threshold value Vtph of the PMOS transistor MP102 in the inverter INV2 in the next stage or lower, which receives the fall of the output signal of the inverter INV1 becomes shorter than in the case where the time constant is large at the beginning of the transition. The PMOS transistor MP102 in the inverter INV2 in the next stage is turned on when the voltage at the connection point between the resistor R1 and the gate of the MOS capacitor MP103 in the preceding stage becomes equal to or less than VDD−|Vthp|, and starts to charge the MOS capacitor MN103. The rising waveform of the output signal of the inverter INV2, has a time constant at the start of the transition which is smaller than in the end of the transition, so that the time required for the output signal voltage to exceed a predetermined level (such as a logic threshold voltage) becomes shorter than in the case where the time constant is large at the start. On the other hand, in the case of the configuration in FIG. 15, the time constant at the start of transition of the falling waveform of the output signal of the inverter JV1 is larger than in the end of the transition, and the slope is gentle.

Thus, the time from the start of the transition to falling to the threshold value Vtph of the PMOS transistor constituting the inverter INV2 (refer to tB in FIG. 19) becomes longer than in the case where the time constant is small at the beginning of the transition.

In the first embodiment of the present invention, due to a sharp fall of the falling waveform of the output signal of the inverter INV1 at the start of the transition, the time for the output signal of the inverter to fall to the threshold value Vtph or lower is short: it contributes more effectively to the effect of suppressing an increase in the delay time when the power supply voltage VDD has been reduced. This effect also constitutes one of the features of the effects of this embodiment.

Further, in the first embodiment of the present invention, when the power supply voltage VDD is reduced, driving currents of the MOS transistors constituting the inverters decrease, and then on resistances increase in appearance, the capacitance values of the MOS capacitors MP103 and MN103 relatively decrease. An increase in the amount of delay is thereby suppressed. More specifically, the amplitude of the gate voltage Vg of the MOS capacitor is set to the power supply voltage VDD. Due to reduction of the power supply voltage VDD, the ratio to the threshold voltage Vt when the gate voltage of the MOS capacitor is the power supply voltage is reduced, so that the capacitance of the MOS capacitor decreases. If the gate voltage of the NMOS capacitor has become from 3Vt to 2Vt, the capacitance of the MOS capacitor decrease. Thus, an increase in the time constant determined from the on resistance of the transistor of the inverters and the MOS capacitor is suppressed because the capacitance of the MOS capacitor is reduced even if the power supply voltage is reduced. An increase in the delay time is thereby suppressed. This effect also constitutes one of the features of the effects of this embodiment.

As described above, in the delay circuit according to the first embodiment of the present invention, an increase in the delay time of the rising transition edge of the input signal to the inverter INV1 due to reduction of the power supply voltage VDD is suppressed.

Figure 18:
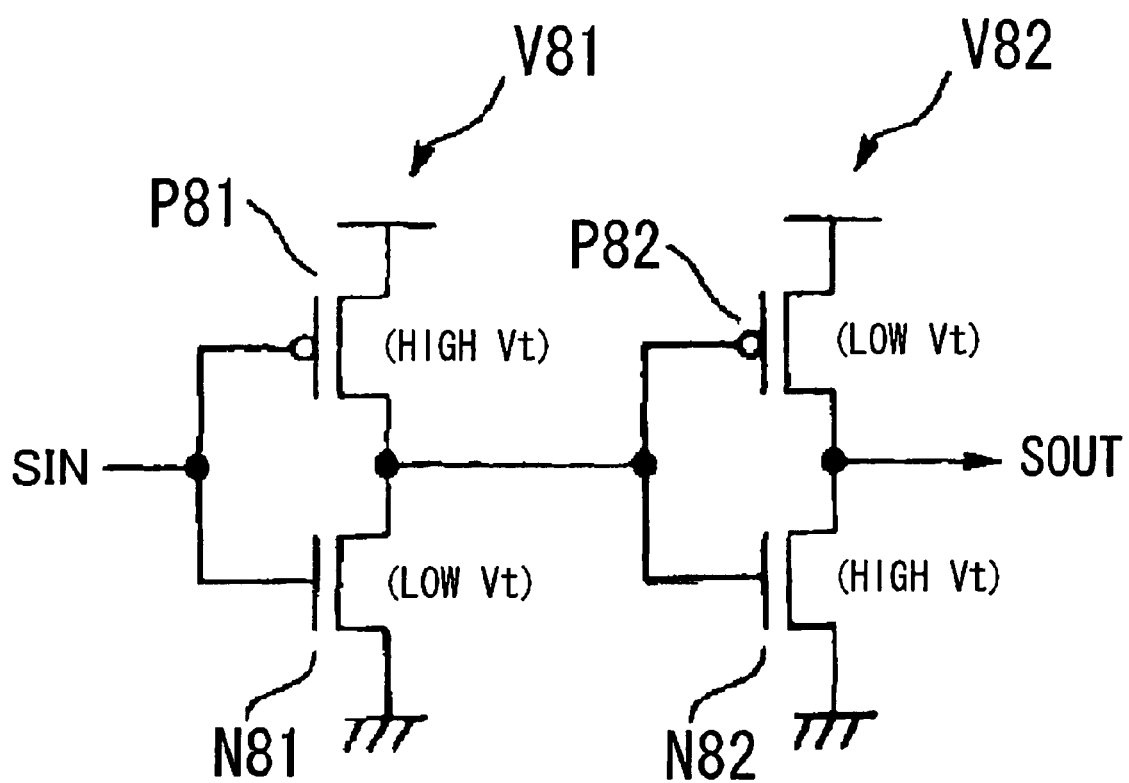
FIG. 18 is a diagram showing an example of a delay circuit proposed in JP Patent Application No. 2001-097083.

Further, in the present embodiment, as in the configuration shown in FIG. 18, the threshold voltage Vthn of the NMOS transistor MN101 in the first inverter INV1 is set to a low value, and the threshold voltage Vthp of the NMOS transistor MP101 in the first inverter INV1 is set to a low value (with an absolute value of |Vthp| being small).

With this arrangement, the input threshold value of the first inverter INV1 is decreased and the input threshold value of the second inverter INV2 is increased, when the power supply voltage VDD is reduced. The delay of the rising transition of the input signal to the high level is made to be relatively shorter than the falling transition of the input signal to the low level, when the power supply voltage VDD is reduced. For this reason, dependency of the delay time of the rise of the input signal to the high level on the power supply voltage is suppressed.

In the delay circuit shown in FIG. 1, which is equipped with the MOS capacitor that is changed from the off state to the on state due to transition of signal at the output section of the inverter, the input threshold value of which is controlled, dependency of the delay time of the rising transition of the input signal from the low level to the high level on the power supply voltage (or the characteristic in which the delay time increases with reduction of the power supply voltage) is suppressed, and the slope indicating the sensitivity (dependency) of the delay time with respect to the reduction of the power supply voltage is controlled to be appreciably flat. This effect also constitutes one of the features of the effects of the present invention.

The resistor R1 is provided between the output of the first inverter INV1 and the gate terminal of the MOS capacitor MP103, and the resistor R2 is provided between the output of the second inverter and the gate terminal of the MOS capacitor MN103. The output of a CR circuit constituted from a resistance R and a capacitance C transitions according to a time constant $\tau(=RC)$ for the resistance R and the capacitance C.

The rising signal waveform of this CR circuit is expressed by:

amplitude×{1−exp(−t/τ)}

The falling signal waveform is expressed by:

amplitude×exp(−t/τ)

The resistance R is a fixed value irrespective of the power supply voltage VDD. Thus, when the amplitude for use is reduced, the delay time required for reaching a certain level such as a logic threshold value is also shortened. It is clear from the fact as well that when approximation is made by connecting the starting point and the ending point (or two points corresponding to high and low levels) of transition of the rising or falling signal waveform of the CR circuit by a straight line, the time of the transition is also halved if the amplitude is halved. That is, when the power supply voltage VDD is reduced, a fall time tr of the inverter INV1 in the first stage and a rise time tf of the inverter INV2 in the second stage are shortened. A propagation delay time tpd from rise of the input signal to rise of the output signal in the delay circuit is shortened when the power supply voltage is reduced.

Next, the resistors R1 and R2 employed in the present embodiment will be described. As the resistors R1 and R2, diffusion resistances each constituted from an impurity doped diffusion region in the substrate surface are employed, for example. n-type diffusion region or n-diffusion region provided in a P-type substrate or a well (having a same impurity concentration as that of an LDD (Lightly Doped Drain) region, with impurity concentration being controlled in high precision, for example) are employed.

In order to reduce the variation of the propagation delay time tpd of the delay circuit due to variation (reduction) of the power supply voltage, the resistors (R1, R2) connected to the output sections of the inverters should be high. On the other hand, when the high resistance is implemented by the diffusion resistance, its area increases. The resistance values of the resistors (R1, R2) are set based on the range of the power supply voltage to be reduced, the set delay amount of the delay time, and its variation level, and the like. For practicality, the resistance values may be set to several ten kilo ohms, which is about the same as the on resistances of the MOS transistors in the inverter, or in the order to several mega ohms. When the resistance values are set to be about the same as the on-resistances of the transistors, the resistances are formed in the areas that are almost the same as that of the diffusion region of the transistors, so that an increase in the area of a chip is prevented.

Figure 2:
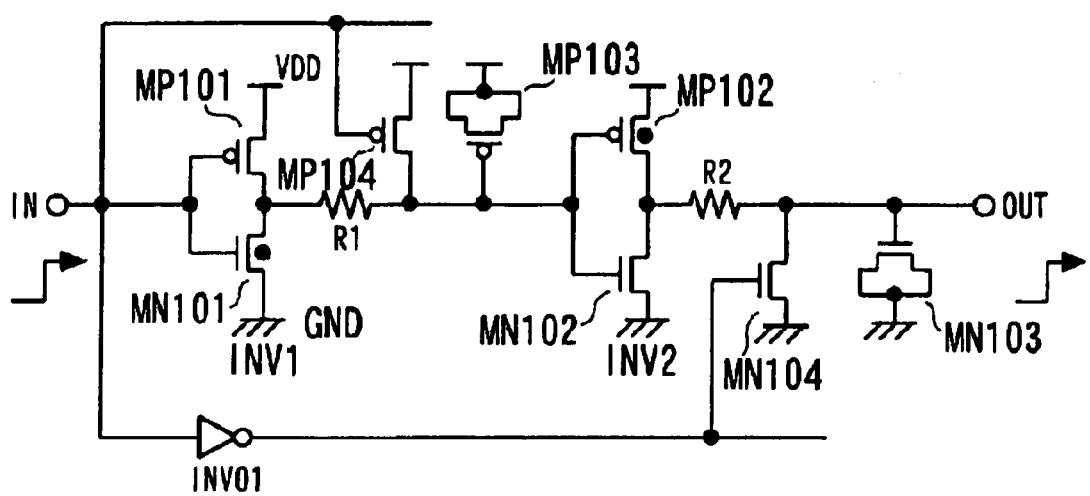
FIG. 2 is a diagram showing a configuration of a delay circuit according to a second embodiment of the present invention.

Next, a delay circuit in a different embodiment of the present invention will be described. FIG. 2 is a diagram showing a configuration of the delay circuit in a second embodiment of the present invention. Referring to FIG. 2, same reference numerals are assigned to same components as those in FIG. 1. In the second embodiment of the present invention, in addition to the delay path, a reset circuit is provided for the delay circuit in the embodiment shown in FIG. 1. More specifically, referring to FIG. 2, a PMOS transistor MP104, an inverter INV01, and an NMOS transistor MN104 are provided. The source of the PMOS transistor MP104 is connected to the power supply VDD. The drain of the PMOS transistor MP104 is connected to a connection node between the resistor R1 and the gate of the MOS capacitor MP103. The PMOS transistor MP104 receives an input signal at its gate. The inverter INV01 receives the input signal and outputs its inverted signal. The source of the NMOS transistor MN104 is connected to the ground (GND). The drain of the NMOS transistor MN104 is connected to a connection node between the resistor R2 and the gate of the MOS capacitor MN103. The NMOS transistor MN104 receives the output signal of the inverter INV01 at its gate.

In the present embodiment, when the input signal supplied to the terminal IN rises from the low level to the high level, the output signal of the output terminal OUT is delayed and rises, as in the first embodiment described before. Then, the propagation delay time from rise of the input signal from the low level to the high level to rise of the output signal from the low level to the high level due to reduction of the power supply voltage VDD is reduced. On the other hand, the propagation delay time from fall of the input signal from the high level to the low level to fall of the output signal from the high level to the low level due to reduction of the power supply voltage VDD is not shortened and increases as usual.

An operation in the second embodiment of the present invention will be described. In the present embodiment, when the input signal falls, the output of the inverter INV1 is reset through a reset path. More specifically, when the input signal falls from the high level to the low level, the transistor MP104 with its gate potential made to be low is turned on, so that the gate potential of the MOS capacitor MP103 (supplied to the input terminal of the inverter INV2) is immediately made to be the power supply voltage VDD without delay of the inverter INV1.

Further, the output terminal OUT is immediately made to be at the ground voltage GND without passage through the delay path between the inverters INV1 and INV2, but through the reset path. More specifically, when the input signal falls from the high level to the low level, the potential at the inverter INV01 goes high, so that the transistor MN104 is turned on. Then, the output terminal OUT is discharged to be reset to the ground voltage GND.

In the present embodiment, with this arrangement, even in the case where a pulse signal input to the input terminal IN has fallen and then the next pulse signal is immediately input, the delay circuit can delay the respective rising edges of the two consecutive pulse signals to output the delayed signals.

Figure 3:
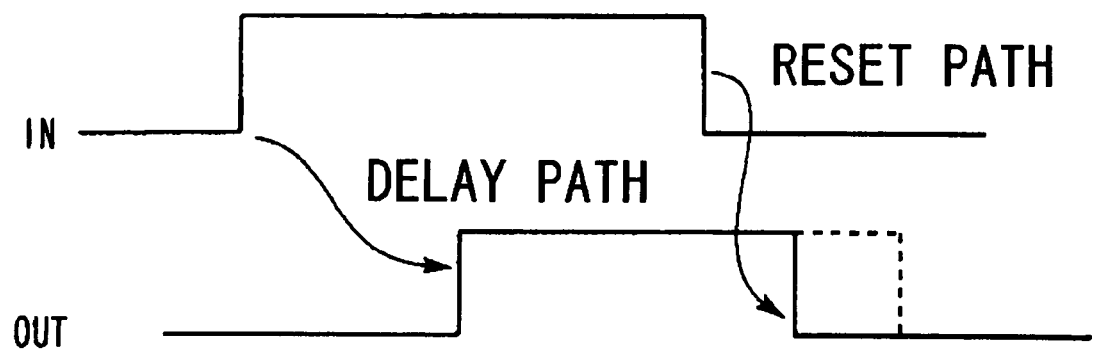
FIG. 3 is a diagram for explaining a timing operation of the delay circuit according to the second embodiment of the present invention.

On the other hand, in the delay circuit according to the embodiment which has no reset circuit, shown in FIG. 1, in response to fall of the input signal, its output signal is delayed and output, as shown in a broken line in FIG. 3. If a second pulse signal having a rising transition is input to the input terminal IN during an interval between the fall timing of the input signal and the timing associated with the broken line, the output sections of the inverters INV1 and INV2 have not been set to the power supply voltage VDD and the ground voltage GND, respectively, immediately before the rise of the second pulse signal. Thus, the rising edge of the second pulse signal sometimes cannot be delayed and output with the delay amount originally specified.

On contrast therewith, in the delay circuit according to the second embodiment of the present invention, in response to fall of the input signal, the output nodes of the inverters INV1 and INV2 are reset by the reset circuit independent of the delay path. Thus, reduction of a time interval from input of a preceding pulse signal to the delay circuit to input of the next pulse signal to the delay circuit is effected.

Next, a third embodiment of the present invention will be described. FIG. 4 shows a configuration of the third embodiment of the present invention. Referring to FIG. 4, the third embodiment includes a PMOS capacitor MP203, an NMOS transistor MN203, a PMOS capacitor MP204, and an NMOS transistor MN204. One terminal of the resistor R1 is connected to the output terminal of the first inverter INV1. The PMOS capacitor MP203 is connected between the other terminal of the resistor R1 and the power supply VDD. The NMOS transistor MN203 is connected between the other terminal of the resistor R1 and the ground power supply GND. One terminal of the resistor R2 is connected to the output terminal of the second inverter INV2. The PMOS capacitor MP204 is connected between the other terminal of the resistor R2 and the ground power supply GND. The NMOS transistor MN204 is connected between the other terminal of the resistor R2 and the ground power supply GND.

In the third embodiment of the present invention, the delay path for the rising transition edge of the input signal from the low level to the high level has a reverse sensitivity characteristic in which the delay time is reduced with reduction of the power supply voltage, as in the embodiments described before. In addition to that, delay paths having the reverse sensitivity characteristic with respect to reduction of the power supply voltage are prepared for the falling transition edge of the input signal from the high level to the low level as well. More specifically, with respect to the falling transition edge of the input signal from the high level to the low level, an increase in the delay time due to reduction of the power supply voltage is suppressed by the delay paths between the resistor R1 connected to the output terminal of the inverter INV1 and the NMOS transistor MN203 and between the resistor R2 connected to the output terminal of the inverter INV2 and the PMOS transistor MN 204.

Further, in the third embodiment of the present invention, the NMOS transistor MN201 and the PMOS transistor MP201, constituting the inverter INV1, both have low threshold voltages. The NMOS transistor MN202 and the PMOS transistor MP202, constituting the inverter INV2, both have low threshold voltages, too.

With this arrangement, the third embodiment of the present invention has the reverse sensitivity characteristic, (which will be also referred to a "reverse characteristic") in which for both rising and falling transitions of the input signal, the delay times decrease with reduction of the power supply voltage VDD without increasing.

Next, the fourth embodiment of the present invention will be described. FIG. 5 is a diagram showing a configuration of a delay circuit in the fourth embodiment of the present invention. Referring to FIG. 5, the same reference numerals are assigned to the components that are identical to those in FIG. 4. Incidentally, through FIG. 5 shows four stages of inverters, the present invention is not limited to this configuration. In the fourth embodiment of the present invention, aside from the delay path, a reset circuit is added to the configuration of the third embodiment described before, shown in FIG. 4. A configuration of the reset circuit that constitutes a difference with the third embodiment will be described.

Referring to FIG. 5, the reset circuit includes a PMOS transistor MP207, an NMOS transistor MN207, and an NMOS transistor MN208. The source and the drain of the PMOS transistor MP207 are connected to the high potential power supply VDD and the source of the MOS transistor MP201 of the first inverter INV1, respectively. The PMOS transistor MP207 receives a chip select signal (CS⁻ being active at the low level) at its gate. The drain and the source of the NMOS transistor MN207 are connected to the connection point between the output terminal of the inverter IV1 and one terminal of the resistor R1 and the ground power supply GND, respectively. The NMOS transistor MN207 receives the chip select signal CS⁻ at its gate. The drain and the source of the NMOS transistor MN208 are connected to the MOS transistor MN202 of the inverter INV2 and the ground power supply GND, respectively. The NMOS transistor MN208 receives the inverted signal of the chip select signal (CS; the inverted signal of the signal CS⁻) at its gate. The inverters INV3 and INV4 at subsequent stages have the same configuration.

Next, an operation of the reset circuit will be described. When the chip select signal (CS⁻) is at the low level, the PMOS transistor MP207 is turned on, and the inverter INV1 is connected to the power supply VDD. The NMOS transistor MN208 is turned on, and the inverter INV2 is connected to the ground power supply GND. When the chip select signal (CS⁻) transitions from the low level to the high level, the PMOS transistor MP207 is turned off, and the inverter INV1 is disconnected from the power supply VDD. Then, the NMOS transistor MN208 is turned off, and the inverter INV2 is disconnected from the power supply GND. At this point, the NMOS transistor MN207 is turned on, and the output of the inverter INV1 is made to be at the ground voltage. The outputs of a pair of an inverter INV3 and an inverter INV4 are reset in the same manner as a pair of the inverter INV1 and the inverter INV2.

Next, a semiconductor memory device according to an embodiment of the present invention will be described. FIG. 6 is a diagram showing a configuration of the semiconductor memory device according to a first embodiment of the present invention.

Referring to FIG. 6, this semiconductor memory device includes a peripheral circuit 10 which receives an address signal, a data signal, a control signal, and the like and outputting data or the like and a cell core unit (a memory cell core unit excluding the peripheral circuit) 20. A memory cell 200 is provided at an intersection between a word line and a bit line in the cell core unit 20. The memory cell 200 is configured to have one transistor and one capacitor, and includes an NMOS transistor 203 as a cell transistor. The NMOS transistor 203 has a gate connected to a word line 201, has one of the source and the drain thereof connected to a bit line 202 and has the other of the drain and the source thereof connected to one terminal of a capacitance 204. The other terminal of the capacitance 204 is connected to a ½ VDD (half of the power supply voltage) power supply according to a half VCC method, for example. Incidentally, the other terminal of the capacitance 204 may be of course connected to the ground power supply.

In the semiconductor memory device according to the embodiment of the present invention, a configuration of the above described first through fourth embodiments is employed, for example, as a delay circuit 11 in the peripheral circuit 10. More specifically, the delay circuit for outputting a delayed signal for generating a rising (or falling) transition timing of the control signal supplied from the peripheral circuit 10 to the cell core unit 20 or a falling (or rising) transition timing for defining the pulse width of the control signal is constituted from the delay circuit that exhibits the reverse sensitivity characteristic in which the delay time decreases with reduction of the power supply voltage.

An input signal to a word line driver 13 for driving a selected word line 15 is generated, based on the result of an operation of a logic circuit 12 which receives a signal φp that is input to the delay circuit 11 and the output of the delay circuit 11. Likewise, a signal for controlling activation of a sense amplifier 14 which is connected to a data line (bit line) 16 of the memory cell core 20, a signal for controlling precharging of a bit line are also generated based on the outputs of delay circuits (not shown) prepared respectively. These delay circuits also exhibit the reverse sensitivity characteristic in which the delay time decreases with reduction of the power supply voltage.

The driver 13 for driving a word line is driven by a boosted voltage VBOOST from a booster circuit 40. When a signal supplied to the word line driver 13 is active, the word line 15 is driven to a high voltage. The larger a difference voltage between the boosted voltage VBOOST and the power supply voltage VDD, the faster the operation speed of the memory cell transistor 203 in the cell core unit 20 becomes, but current consumption increases. Accordingly, without alteration, the semiconductor memory might not be suitable for a configuration that effects lower current consumption during standby. As will be described later, preferably, the peripheral circuit 10 and the cell core unit 20 in the semiconductor memory device according to the present embodiment are driven by the low voltage power supply.

The semiconductor memory device according to the embodiment of the present invention includes a reference voltage source circuit 30 for generating a reference voltage Vref that does not depend on the power supply voltage and the booster circuit 40 for generating the boosted voltage that does not depend on the power supply voltage, based on the reference voltage Vref. The boosted voltage VBOOST from the booster circuit 40 is supplied to the word line driver 13, so that the constant boosted voltage that does not depend on the power supply voltage is supplied to the word line.

Setting the boosted voltage VBOOST to a constant voltage that does not depend on elevation and lowering of the power supply voltage constitutes one of main features of the semiconductor memory device according to the present embodiment.

In the semiconductor memory device according to the present embodiment, the power supply voltage VDD is supplied to the peripheral circuit 10, cell core unit 20, reference voltage source 30, and booster circuit 40. In the present embodiment, the power supply voltage VDD supplied to the power supply terminal of the semiconductor memory device is set to a low voltage power supply. Inside the semiconductor memory device, a stepped-down internal power supply voltage VINT is not employed.

Then, as shown in FIG. 6, driving the peripheral circuit 10 and the cell core unit 20 by the low voltage power supply VDD, thereby implementing a desired access speed constitutes one of main features of the semiconductor memory device according to the present embodiment.

More specifically, in the semiconductor memory device according to the present embodiment, even if the cell core unit 20 is driven by the low voltage power supply, the constant voltage that does not depend on the power supply voltage is supplied to the gate of the NMOS transistor 203 at the intersection between the word line 201 and the bit line 202 in the cell core unit 20, so that a difference voltage between the boosted voltage VBOOST and the power supply voltage VDD when driven by the low voltage power supply is performed is set to be large.

As a result, in the semiconductor memory device according to the present embodiment, even when the cell core unit 20 is driven by the low voltage power supply, a high-speed operation of the memory cell transistor 203 is attained, and a necessary write voltage is fed to the cell capacitance 204 which has one terminal connected to the output of the cell transistor 203.

Figure 9:
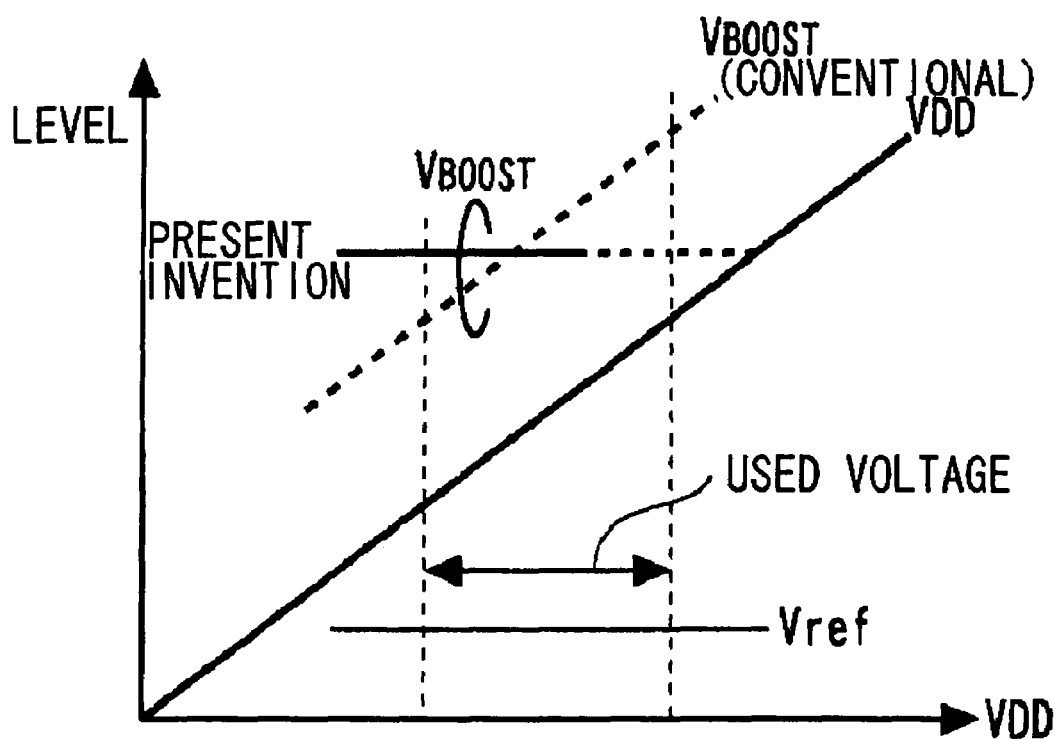
FIG. 9 is a graph for explaining an operation principle when a power supply voltage has been changed in the semiconductor memory device according to the present invention and an operation of a conventional semiconductor memory device as a comparison example.

FIG. 9 is a graph for explaining the relationship between the boosted voltage VBOOST and the power supply voltage VDD in the semiconductor memory device according to the present invention. As shown in FIG. 9, in the semiconductor memory device according to the embodiment of the present invention, the boosted voltage VBOOST is set to be constant, without depending on elevation and lowering of the power supply voltage VDD. When the power supply voltage VDD is a low voltage, a level difference with the power supply voltage VDD increases more than in the case where driving by the high voltage power supply voltage is performed.

When the power supply voltage VDD is a high voltage, a level difference between the boosted voltage VBOOST and the power supply voltage VDD decreases more than in the case where driving by the low power supply voltage is performed. For the upper limit of the voltage range used for the power supply voltage, the power supply voltage of the order of VDD+Vt (where Vt is a threshold voltage of the NMOS transistor) or more is secured as the boosted voltage VBOOST.

Even when the power supply voltage VDD for the peripheral circuit 10 constituted from an X decoder for decoding a row address and driving a selected word line, a Y switch selector for decoding a column address and turning on a Y switch for a selected bit line, and a sense amplifier for amplifying a potential at a bit line and the cell core unit 20 are made to be a low voltage in the embodiment shown in FIG. 6, the constant voltage that does not depend on the power supply voltage is supplied as the boosted voltage supplied to the cell core unit 20 such as the gates of memory cell transistors and the like.

Figure 7:
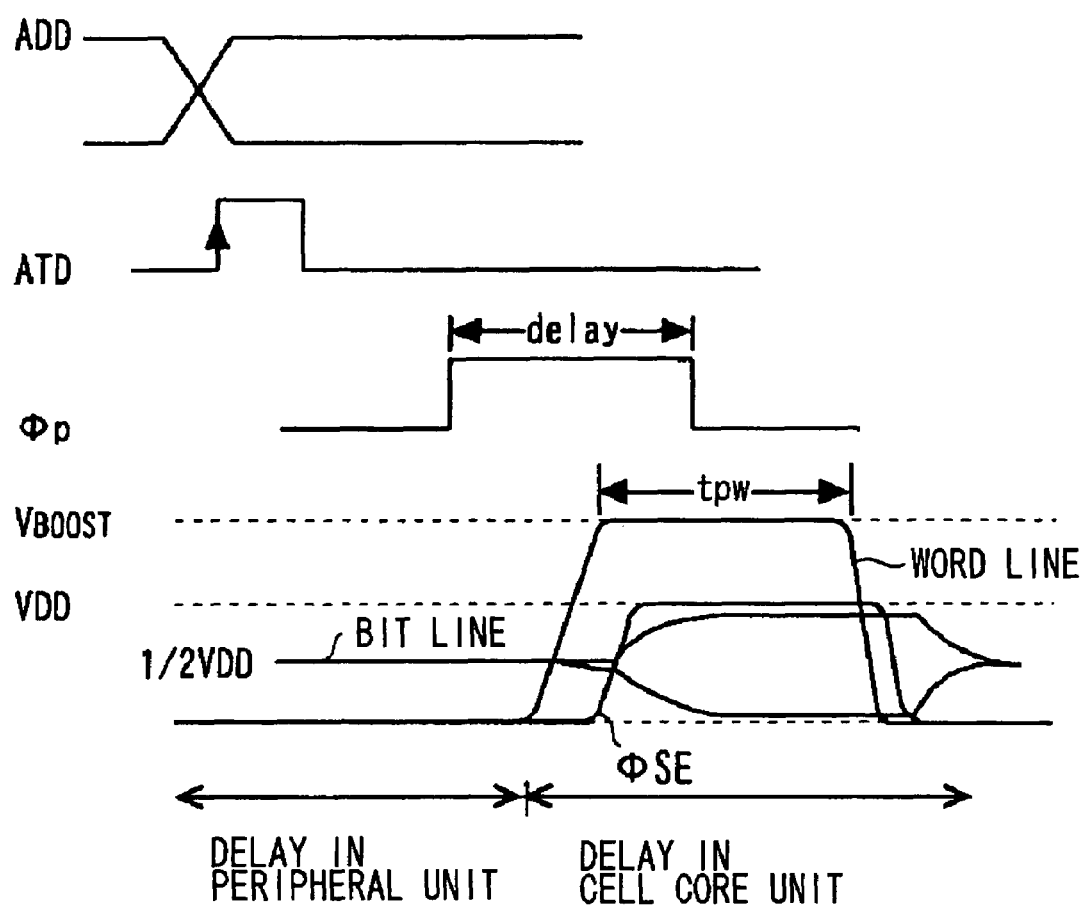
FIG. 7 show diagrams for explaining timing operations in the semiconductor memory device according to the embodiment of the present invention.

FIG. 7 is a diagram for explaining the timing operation of an asynchronous type dynamic RAM shown in FIG. 6. A transition in an address in a memory cycle is detected by an address transition detection circuit not shown, so that an ATD signal is activated. Then, a strobe signal φp (edge signal or pulse signal) for activating a row address is generated based oh this ATD signal, the result of decoding an address signal, and a control signal (such as a chip selection signal or a write enable signal) not shown for controlling access to the memory. In the timing diagram of FIG. 7, the time from the start of the memory cycle to the rise of a word line is an access time (delay time) of the peripheral circuit 10, and the time from then on is an access time (delay time) of the cell core unit 20.

The logic circuit 12 performs a logic operation (such as an AND operation) of this signal φp and a signal obtained by delaying the signal φp by the delay circuit 11 and then outputs the result of the operation. In the case of the AND operation, a signal of which rise and fall of pulses are defined by the rising transition edge of the signal φp and the rising transition edge of its delayed signal is output. The word line driver 13 drives a word line based on the output signal of this logic circuit 12, and the rise or fall (pulse width) of the word line is controlled. Likewise, a signal φSE for controlling activation of the sense amplifier 14 for amplifying a signal read onto the bit line 16, or a Y switch enable signal not shown, a control signal for pre-charging the bit line to ½ VDD and the like are generated. The high level side of the amplitude of a selected bit line is amplified to the power supply voltage VDD by the sense amplifier 14. The operation of refreshing the dynamic random access memory is performed by writing back to a memory cell the voltage at the bit line read out and then amplified by the sense amplifier 14.

When the configurations in the first through fourth embodiment are employed as the delay circuit 11 in FIG. 6 and the low voltage external power supply is used as the power supply voltage VDD of the peripheral circuit, the delay time of the delay circuit 11 is reduced more than in the case where driving by the high voltage power supply is performed. The delays of the rising transition timing and the pulse width of a word line driven to the boosted voltage level, the transition timing of the pulse and the pulse width of the signal φSE for activating the sense amplifier 14 are not increased, so that the access time of the cell core unit is reduced.

On the other hand, ordinary logic circuits in the peripheral circuit 10 have a characteristic that their delay times increase with lowering of the power supply voltage. Since the peripheral circuit 10 is driven by the low voltage power supply VDD, the access time of the peripheral circuit 10 increases a little more than in the case where the peripheral circuit 10 is driven by the high power supply voltage, as explained in the prior art. As a result, when driving by the low voltage power supply VDD is performed, an increase in a total delay time td obtained by combining the (increased) delay of the cell core unit 20 and the (reduced) delay of the peripheral circuit 10 is suppressed.

FIG. 8 is a diagram showing a configuration of a circuit for generating the boosted voltage VBOOST according to an embodiment of the present invention. Referring to FIG. 8, a band-gap-reference circuit 30 for outputting the reference voltage Vref that is constant irrespective of a change in temperature and a change in the power supply voltage is provided as the reference voltage source circuit 30 in FIG. 6. The band-gap-reference circuit 30 outputs the reference voltage Vref of VBE+K×VT (in which K indicates a constant, VBE indicates the base-to-emitter voltage of a bipolar transistor, VT (=kT/q) is a thermal voltage, in which q indicates the unit charge of an electron, k indicates the Boltzman constant, and T indicates an absolute temperature). Then, there are provided a comparison circuit 41 for comparing the reference voltage Vref output from the band-gap-reference circuit 30 with the voltage obtained by voltage-dividing the boosted voltage VBOOST by resistors R11 and R12, and the booster circuit 40 for receiving the result of comparison by the comparison circuit 41 and charging a charge pump and performing voltage boosting when the result of the comparison indicates that the divided voltage is smaller than the reference voltage Vref. The booster circuit 40 generates the boosted voltage based on the reference voltage Vref that does not depend on the power supply voltage VDD. For this reason, the boosted voltage VBOOST to be output is made to be the constant voltage that does not depend on a change in rise and fall of the power supply voltage VDD.

The boosted voltage VBOOST is supplied as a power supply voltage for driving the word line driver 13 in FIG. 6 or the like, and a selected word line is driven by the boosted voltage that does not depend on the power supply voltage. Even when the power supply voltage VDD is reduced, the voltage supplied to the word line is kept to be the same as the voltage when the power supply voltage VDD is high, so that reduction of the access speed to a memory cell due to reduction of the power supply voltage is suppressed.

With this arrangement, in the semiconductor memory device according to the present embodiment, even at the time of operation with the low voltage power supply, the boosted voltage for a selected word line and the like does not depend on the power supply voltage and is kept to be constant. For this reason, an increase in the access time of a memory cell is suppressed.

Figure 11:
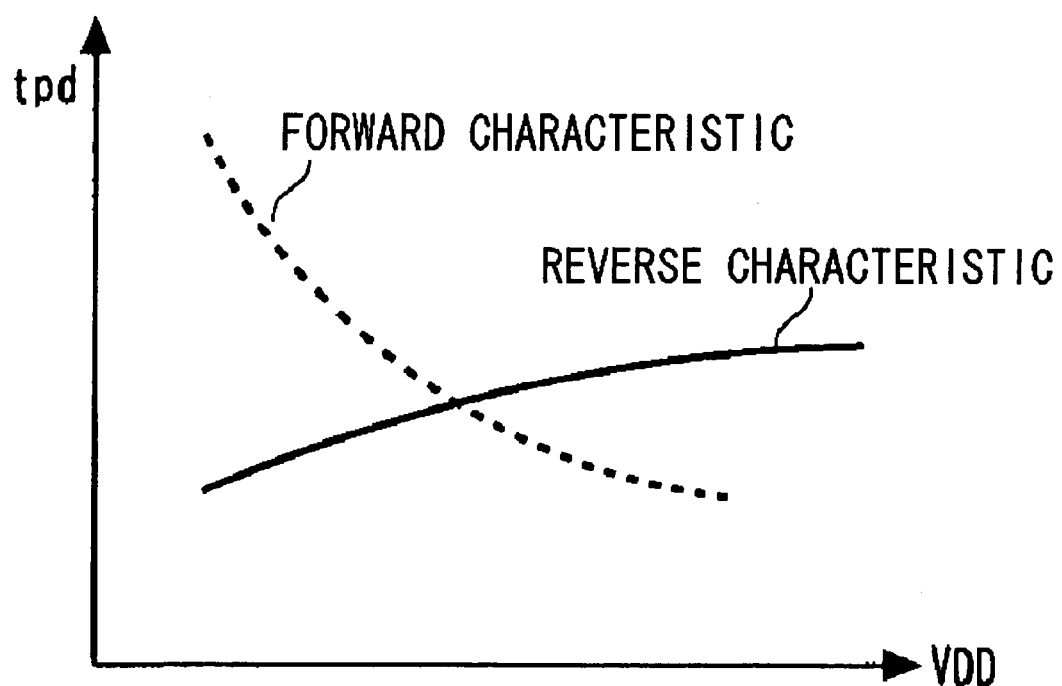
FIG. 11 is a graph comparing power supply dependency of the delay time of a delay circuit according to the present invention with power supply dependency of the delay time of a conventional delay circuit as a comparison example, for explanation.

The delay circuit according to the present embodiment for determining the delay time, the pulse width and the like of the control signal generated from the reference signal, tends to have the reverse sensitivity characteristic in which its delay time tpd decreases at the time of operation with the low voltage, as shown in FIG. 11. In the present specification, the characteristic in which the delay time decreases with reduction of the power supply voltage is referred to as the "reverse characteristic", whereas the characteristic in which the delay time increases with reduction of the power supply voltage is referred to as a "forward characteristic". As a result, the delay time of the cell core unit 20 is reduced at the time of low voltage operation. Even with the increase of the delay time of the peripheral circuit 10 made up of an ordinary logic system, the delay time of which is increased at the time of low voltage operation, an increase in the delays of both of the peripheral circuit 10 and the cell core unit 20 is suppressed due to reduction of the delay time of the cell core unit 20.

Figure 10:
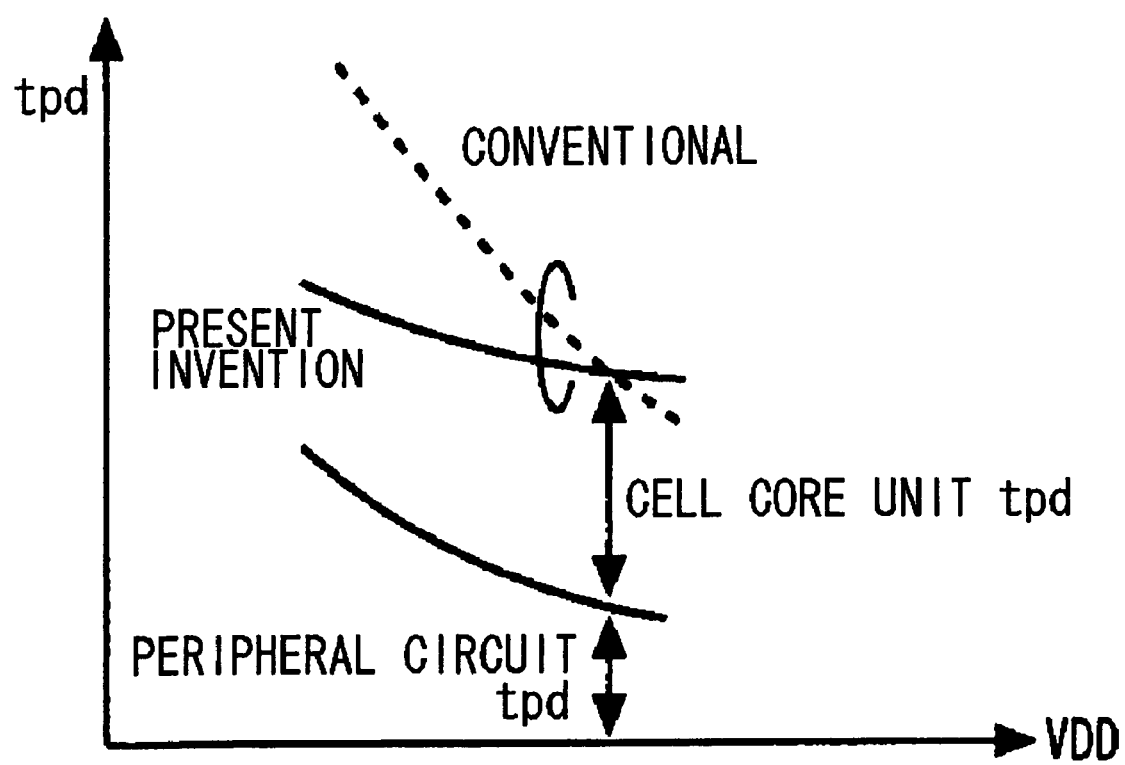
FIG. 10 is a graph for comparing an access time when the power supply voltage has been changed in the semiconductor memory device according to the present invention with an access time of the conventional semiconductor memory device as the comparison example, for explanation.

In the case of the conventional circuit which does not have the configuration according to the present invention and of which the boosted voltage depends on the power supply voltage, used as a comparison example, the boosted voltage supplied to the cell core unit is reduced, the access time of the cell core unit is increased, and the transition timing and the pulse width of the control signal is delayed at the low voltage operation. Thus the delay time increases. Then, due to an increase in the delay time of the peripheral circuit 10 having the ordinary logic system, the delay time of which increases at low voltage operation and an increase in the delay time of the cell core unit 20, the delay time combining both of the delay times markedly increase. The relationship between the delay time and the power supply voltage VDD of this comparison example is indicated by a broken line (indicated by "conventional") in FIG. 10. Incidentally, referring to FIG. 10, the horizontal axis indicates the power supply voltage, while the vertical axis indicates the propagation delay time.

On contrast therewith, in the present invention, the delay time of the cell core unit decreases with reduction of the power supply voltage VDD. As shown by a real line (indicated by the "present invention") in FIG. 10, an increase in the delay time is more suppressed than with a conventional method.

Figure 12:
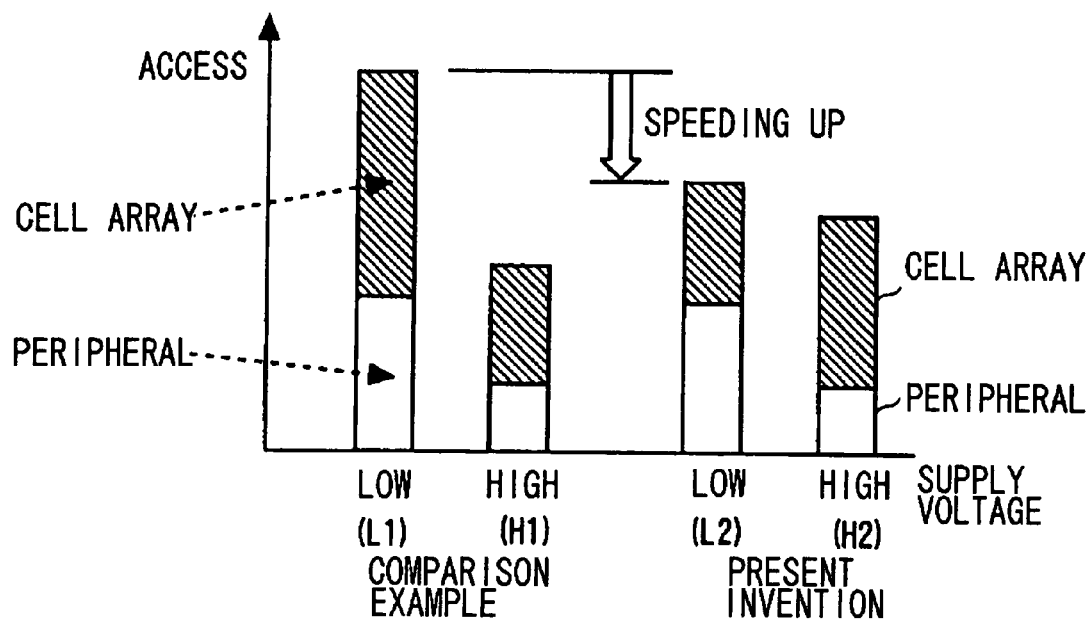
FIG. 12 is a graph comparing access times when a power supply voltage is set to be low and high in the semiconductor memory device according to the present invention with access times of the conventional semiconductor memory device as the comparison example.

FIG. 12 shows the relationship between the elevation and reduction of the power supply voltage (plotted on the horizontal axis) and the access time (plotted on the vertical axis) in the form of a graph in the present invention and the configuration of a conventional memory that does not have the configuration of the present invention, as a comparison example.

It is assumed that the memory is constituted from the cell core unit (cell array) and a peripheral unit. In the present invention, the peripheral unit is assumed to include the delay circuit (indicated by reference numeral 11 in FIG. 6) that exhibits the reverse characteristic (refer to FIG. 11) with respect to the characteristic between the power supply voltage and the delay time, and the delay of the control signal over the cell core unit 20 is controlled by this delay circuit 11. Further, the boosted voltage is assumed to be constant, without depending on the power supply voltage.

In the conventional memory that does not have the configuration of the present invention, when the power supply voltage VDD is raised, the boosted voltage VBOOST is also raised, operations of the cell core unit and the peripheral unit are both sped up, the overall access time is reduced, and the operation speed becomes fast (indicated by a reference numeral H2 in FIG. 12).

On the other hand, when the power supply voltage VDD is reduced, the boosted voltage VBOOST is also reduced. Further, since the delay time of the delay circuit increases due to reduction of the power supply voltage as shown in FIG. 11 as the forward characteristic, the delay of the control signal also increases. For this reason, reduction of the access speed of the cell core unit is marked, the operation speed of the logic circuits in the peripheral circuit is reduced, so that the overall access time becomes remarkably slow, compared with the case of the high power supply voltage (indicated by a reference numeral L1 in FIG. 12).

In the semiconductor memory device according to the present invention, even if the power supply voltage VDD is raised, the boosted voltage VBOOST is constant, so that a difference voltage between the power supply voltage VDD and the boosted voltage VBOOST decreases. The delay of the control signal over the cell core unit increases a little more than in the case of driving by the low voltage due to the reverse characteristic of the delay circuit for generating the timing of the control signal. For this reason, the access time of the cell core unit increases more slightly than in the case of driving by the low voltage (as shown by the hatched portion indicated by reference numeral H2 in FIG. 12). Further, the access time of the cell core unit is longer than the access time indicated by reference numeral H1 in the comparison example.

On the other hand, when the power supply voltage VDD is raised, the operation of the peripheral circuit is sped up, and overall access is determined from the sum of the delays of the peripheral circuit and the cell core unit. In this case, the access time becomes longer than in the comparison example H1 that does not have the configuration of the present invention (indicated by reference numeral H2 in FIG. 12).

In the present invention, due to driving by the low voltage, when the power supply voltage is reduced, the boosted voltage is constant. Thus, the delay time of the control signal decreases more than in the case of the driving by the high voltage due to the reverse characteristic. Thus, the access time of the cell core unit decreases more than in the case of driving by the high voltage (indicated by a reference numeral H2). This is one of the significant features of the present invention.

The operation speeds of the logic circuits of the peripheral unit decrease, and the access time increases due to the low voltage drive. However, the overall access time of the cell core unit and the peripheral circuit becomes longer more slightly than in the case of the high voltage power supply. Thus, a considerable increase in the access time due to the low voltage operation as in the comparison example is avoided. While effecting low power consumption, the present invention can attain a constant access speed.

In the present invention, in addition to the form of power supply in which the cell core unit is driven by the low voltage power supply and the peripheral circuit is driven by the low voltage power supply, the cell core unit may be driven by the low voltage power supply and the peripheral circuit may be driven by the high voltage power supply, as will be described later. In this case, the delay circuit having the reverse characteristic is driven by the low voltage power supply.

The architecture of the semiconductor memory device according to the present invention is suitable for being applied to a memory that implements driving by the low voltage power supply using battery driving and lower power consumption.

Further, since the delay amount of the control signal for the cell core unit does not increase even by the low voltage power supply, when the architecture of the present invention is employed for the memory that performs an automatic refresh operation in a standby state or the like, reduction of a refresh time is implemented, so that speeding up of accesses and a memory cycle is implemented.

More specifically, when the present invention is carried out for a dynamic RAM (which will be also referred to as a "pseudo-SRAM") mounted on a portable device and with its external specifications compliant with a static RAM, reduction of an access time from the processor to the memory at the time of a standby operation can be effected. Since the processor or a controller handles this memory as the SRAM, its control does not involve a refresh operation on the dynamic RAM or the like. The dynamic RAM periodically performs an automatic refresh within the dynamic RAM. When a memory access from the processor or the controller coincides with a refresh within the dynamic RAM, the refresh is performed, and then memory access to the associated cell is performed. In this case, in the present embodiment, the times of the transition edge timing, the pulse width and the like of signals, such as, a signal for controlling the start and end of precharging a bit line, a signal for controlling rise and fall of a selected word line, and a signal for controlling activation of the sense amplifier during a refresh operation do not increase even when the device is operated by the low voltage power supply, and is shortened to the contrary, as a result of which, the time of the refresh operation is shortened, reduction of power consumption is effected, and a wait time for a subsequent access is shortened, so that the access speed increases.

Figure 13:
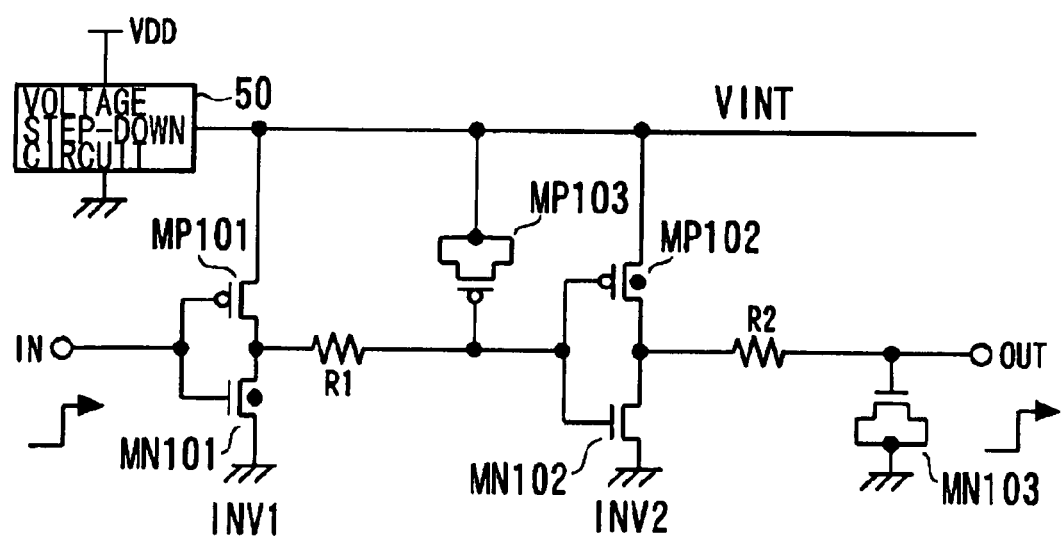
FIG. 13 is a diagram showing a configuration of a delay circuit according to a fifth embodiment of the present invention.

Next, a still another embodiment of the present invention will be described. In the above described embodiments shown in FIGS. 1 through 5, and FIG. 6, the power supply voltage VDD is reduced. Thus, the power supply voltage is not stepped down, and is used as the power supply voltage inside the semiconductor device, without step-down conversion. However, the present invention is not of course limited to this configuration. FIG. 13 is a diagram showing a configuration of a delay circuit according to a fifth embodiment of the present invention. Referring to FIG. 13, the same reference numerals are allotted to the components that are identical to those in FIG. 1. Referring to FIG. 13, in the present embodiment, the power supply voltage VDD supplied to the power supply terminal is stepped down by a voltage step-down circuit (internal power supply regulator) 50 to generate the stepped-down voltage (internal power supply voltage) VINT, and the stepped-down power supply voltage VINT is supplied as a high-potential power supply voltage for the inverters INV1 and INV2. Even if the internal power supply voltage VINT is a low voltage, this delay circuit can reduce the delay time of the rising edge of an input signal more than in the case of being driven by the power supply voltage VDD. For this reason, current consumption at the time of being driving by the low voltage power supply such as at the time of standby or the like can be reduced.

Figure 14:
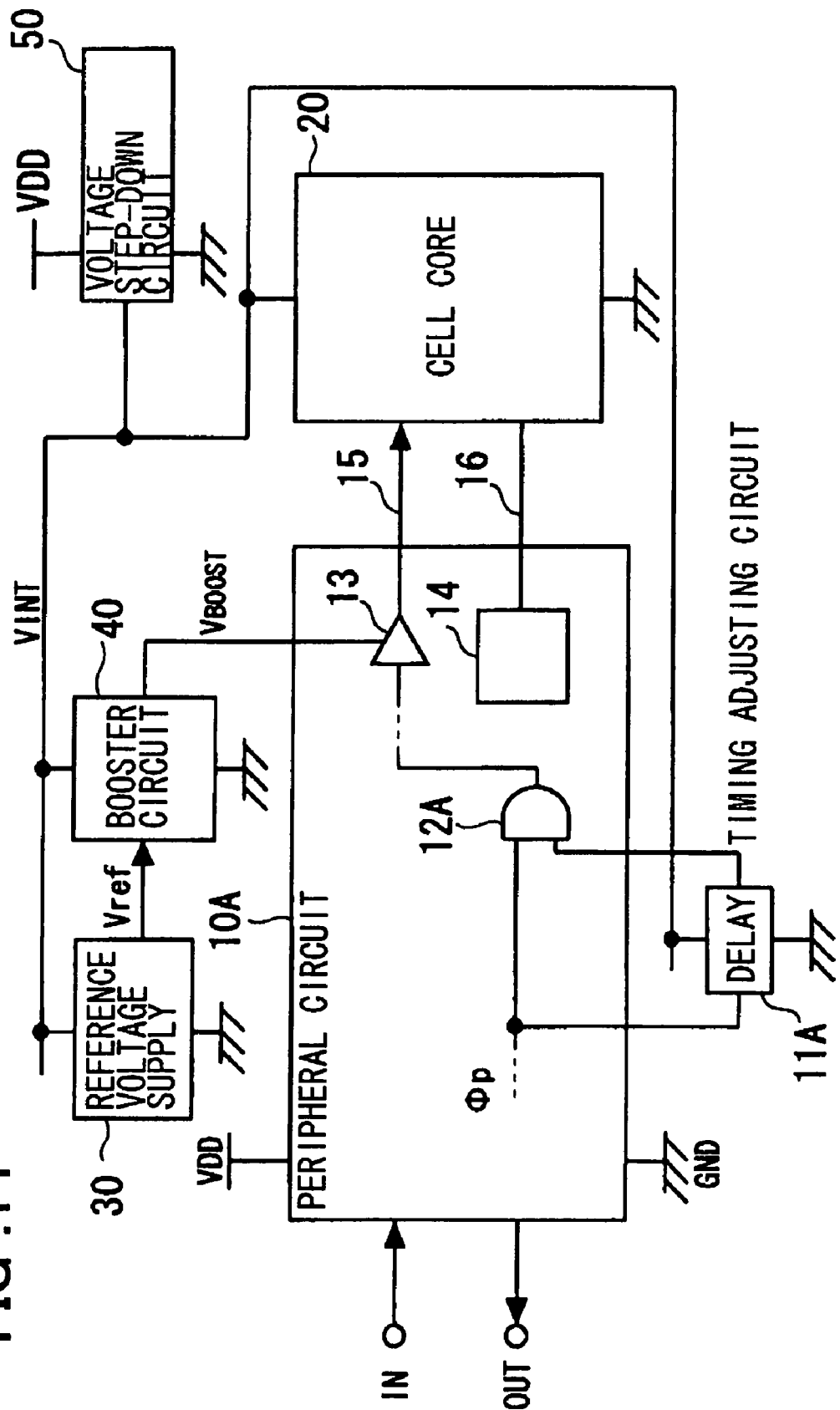
FIG. 14 is a diagram showing a configuration of a semiconductor memory device according to a second embodiment of the present invention.

FIG. 14 is a diagram showing a configuration of a semiconductor memory device according to other embodiment of the present invention. In the present embodiment shown in FIG. 6, the peripheral circuit 10 and the cell core unit 20 are driven by the power supply voltage VDD. On contrast therewith, the present embodiment has two power supply systems. The externally-supplied power supply voltage VDD is fed to the power supply terminal of the semiconductor memory device without alteration, and the internal power supply voltage VINT obtained on stepping down the power supply voltage VDD by the voltage step down circuit (internal power supply regulator) 50 is supplied to the cell core unit 20. The internal power supply voltage VINT is supplied to the reference voltage source 30 and the booster circuit 40 for generating the boosted voltage VBOOST as well.

In the present embodiment, the delay circuit 11A has the configuration shown in FIG. 13, or has the configuration shown in FIGS. 2, 3, or 4 in which the internal power supply voltage VINT is used as the high-potential power supply voltage. The signal φp is supplied to the delay circuit 11A that uses the power supply system different from that for a peripheral circuit 10A, in which the power supply voltage and the delay time have the reverse characteristic shown in FIG. 11. The output signal of the delay circuit 11A is supplied to a logic circuit 12A in the peripheral circuit 10 in the power supply voltage VDD system.

In the present embodiment, the peripheral circuit 10A is driven by the power supply voltage VDD that is higher than the internal power supply voltage VINT, the access speed of the peripheral circuit 10A is increased (but with increased current consumption).

Further, in the present embodiment, the delay circuit 11A having the reverse characteristic is driven by the internal power supply voltage VINT and its delay time is reduced more than in the case of driving by the power supply voltage VDD.

Further, in the present embodiment, the cell core unit 20 is driven by the internal power supply voltage VINT, so that lower power consumption is effected.

In the present embodiment as well, the constant voltage that does not depend on the power supply voltage is supplied as the boosted voltage supplied to the cell core unit 20.

Foregoing descriptions were directed to the present invention in connection with the embodiments described above. The present invention, however, is not limited to the embodiments described above, and naturally includes various variations and modifications that could be performed by those skilled in the art within the respective claims. The semiconductor device according to the present invention is not limited to the configurations of the peripheral circuit and the dynamic RAM, for example. The semiconductor device including the delay circuit having the reverse characteristic of the power supply voltage dependency as the delay circuit inserted into a path through which an increase in the delay time should be suppressed, and other logic circuit having the forward characteristic of the power supply voltage dependency may be operated by the low voltage.

INDUSTRIAL APPLICABILITY

As described above, according to the semiconductor memory device and the control method of the present invention, by connecting one terminal of a resistor to the output section of an inverter, and providing a capacitance element that increases its capacitance value according to a transition of the output of an inverter from a logic corresponding to the power supply side to the other logic between the other terminal of the resistor and the power supply, an increase in the delay time of a delay circuit is suppressed or reduced at the time of being driven by the low voltage power supply, so that the semiconductor memory device and the control method become suitable for being applied to a memory driven by a low voltage power supply. When the delay circuit is driven by the low voltage power supply, the present invention has an effect that the delay time of the delay circuit can be reduced more than in the case of being driven by the high power supply voltage.

According to the present invention, by connecting one terminal of the resistor to the output section of the inverter, and providing a MOS capacitor that is turned from off to on according to a transition of the output of the inverter from a logic corresponding to the power supply side to the other logic in the delay circuit and providing a circuit for resetting the output unit of this inverter, timing margin is given to an interval between neighboring pulses of a pulse train input to the delay circuit, thereby expanding freedom of timing design.

Further, in the semiconductor device according to the present invention, when driven by the low voltage power supply, an increase in the delay time of a signal having edges and a pulse width, generated by the delay circuit can be suppressed and the reduction of the operation speed can be suppressed while effecting reduction of power consumption. The semiconductor device according to the present invention thereby becomes suitable for being applied to an LSI or the like driven by the low voltage.

In the semiconductor memory device according to the present invention, the boosted voltage is set to the constant voltage that does not depend on the power supply voltage, so that when the cell core unit is driven by the low voltage power supply, an increase in the delay of a cell core unit can be prevented while securing the normal operation of a memory cell array and the reduction of an access speed can be suppressed while effecting reduction of power consumption.

In the semiconductor memory device according to the present invention, when driven by the low voltage power supply, an increase in the delay time of the transition edge of a control signal generated based on the delayed signal of the delay circuit can be suppressed, an increase in the delay of the cell core unit can be suppressed, and the reduction of the access speed can be suppressed while effecting reduction of power consumption.

Further, in the semiconductor memory device according to the present invention, the peripheral circuit is driven by the high power supply voltage, the cell core unit is driven by the low voltage power supply, and the delay circuit is driven by the power supply voltage for shortening its delay time, and the boosted voltage is set to a constant voltage that does not depend on the power supply voltage. An increase in the delay of the cell core unit when driven by the low voltage power supply is suppressed, and the operation of the peripheral circuit is sped up. The semiconductor memory device according to the present invention thereby achieves speeding up of access while effecting reduction of power consumption.

As described above, according to the present invention, in response to a demand for lower power consumption such as speeding up of accesses, a decrease in a standby current, or the like, the peripheral circuit and the cell core unit are driven by the low voltage power supply, or the peripheral circuit is driven by the high power supply voltage and the cell core unit is driven by the low voltage power supply. A combination of a driving power supply and power consumption can be thereby optimized.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a memory cell array having a plurality of memory cells arranged in an array form;
   a voltage step down circuit that receives a power supply voltage and outputs a step down voltage that is lower than said power supply voltage;

a voltage step up circuit that receives said step down voltage and outputs a step up voltage;

a peripheral circuit outputting a word line voltage and receiving said step up voltage and said power supply voltage; and a delay circuit being driven by said step down voltage, said delay circuit having a characteristic in which a delay time thereof decreases more when the voltage provided to the delay circuit is low than when the voltage provided to the delay circuit is high.

2. The semiconductor memory device according to claim 1, wherein said peripheral circuit comprises;

a sense amplifier amplifying a high level voltage of a selected bit line to said power supply voltage; and a word line driving circuit driving a selected word line by the step up voltage.

* * * * *